United States Patent
Ogihara et al.

(10) Patent No.: US 8,835,102 B2
(45) Date of Patent: Sep. 16, 2014

(54) PATTERNING PROCESS AND COMPOSITION FOR FORMING SILICON-CONTAINING FILM USABLE THEREFOR

(75) Inventors: Tsutomu Ogihara, Jyoetsu (JP); Takafumi Ueda, Jyoetsu (JP); Toshiharu Yano, Jyoetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 13/416,842

(22) Filed: Mar. 9, 2012

(65) Prior Publication Data

US 2012/0238095 A1    Sep. 20, 2012

(30) Foreign Application Priority Data

Mar. 15, 2011   (JP) ................ 2011-056136

(51) Int. Cl.
| | |
|---|---|
| G03F 7/26 | (2006.01) |
| G03F 7/075 | (2006.01) |
| C08L 83/14 | (2006.01) |
| C09D 183/04 | (2006.01) |
| C08L 83/04 | (2006.01) |
| G03F 7/09 | (2006.01) |
| G03F 7/11 | (2006.01) |
| G03F 7/32 | (2006.01) |

(52) U.S. Cl.
CPC ............... *G03F 7/11* (2013.01); *G03F 7/0752* (2013.01); *C08L 83/14* (2013.01); *C09D 183/04* (2013.01); *C08L 83/04* (2013.01); *G03F 7/091* (2013.01); *G03F 7/325* (2013.01)
USPC ............ 430/325; 430/322; 430/331

(58) Field of Classification Search
CPC ......... C09D 183/04; C08L 83/04; G03F 7/11; G03F 7/0752; G03F 7/091; H01L 21/02126; H01L 21/02216; H01L 21/3122; H01L 21/31144; H01L 21/0274; H01L 21/0276; H01L 21/3144; H01L 21/32137
USPC ................................................. 430/322, 330
See application file for complete search history.

(56) References Cited

U.S. PATENT DOCUMENTS

| | | |
|---|---|---|
| 5,632,910 A | 5/1997 | Nagayama et al. |
| 2002/0187422 A1 | 12/2002 | Angelopoulos et al. |

(Continued)

FOREIGN PATENT DOCUMENTS

| | | |
|---|---|---|
| EP | 1 045 290 A2 | 10/2000 |
| EP | 2 063 319 A1 | 5/2009 |

(Continued)

OTHER PUBLICATIONS

Jul. 26, 2013 European Search Report issued in European Application No. 12001670.4.

(Continued)

*Primary Examiner* — Caleen Sullivan
(74) *Attorney, Agent, or Firm* — Oliff PLC

(57) ABSTRACT

The invention provides a patterning process for forming a negative pattern by lithography, comprising at least the steps of: using a composition for forming silicon-containing film, containing specific silicon-containing compound (A) and an organic solvent (B), to form a silicon-containing film; using a silicon-free resist composition to form a photoresist film on the silicon-containing film; heat-treating the photoresist film, and subsequently exposing the photoresist film to a high energy beam; and using a developer comprising an organic solvent to dissolve an unexposed area of the photoresist film, thereby obtaining a negative pattern. There can be a patterning process, which is optimum as a patterning process of a negative resist to be formed by adopting organic solvent-based development, and a composition for forming silicon-containing film to be used in the process.

15 Claims, 1 Drawing Sheet

(56) References Cited

U.S. PATENT DOCUMENTS

| | | |
|---|---|---|
| 2006/0019195 A1 | 1/2006 | Hatakeyama et al. |
| 2007/0003867 A1 | 1/2007 | Hatakeyama et al. |
| 2007/0238300 A1 | 10/2007 | Ogihara et al. |
| 2007/0275326 A1 | 11/2007 | Hatakeyama et al. |
| 2009/0011366 A1 | 1/2009 | Tsubaki et al. |
| 2009/0136869 A1 | 5/2009 | Ogihara et al. |
| 2009/0148789 A1 | 6/2009 | Amara et al. |
| 2010/0040972 A1 | 2/2010 | Tarutani et al. |
| 2010/0167024 A1 | 7/2010 | Natsume et al. |
| 2010/0167212 A1 | 7/2010 | Cho et al. |
| 2011/0241175 A1* | 10/2011 | Koh et al. .................. 257/618 |
| 2012/0058427 A1 | 3/2012 | Enomoto et al. |

FOREIGN PATENT DOCUMENTS

| | | |
|---|---|---|
| EP | 2 138 898 A1 | 12/2009 |
| EP | 2 372 458 A1 | 10/2011 |
| JP | A-7-181688 | 7/1995 |
| JP | A-7-183194 | 7/1995 |
| JP | A-2004-153125 | 5/2004 |
| JP | A-2005-128509 | 5/2005 |
| JP | A-2005-520354 | 7/2005 |
| JP | A-2007-25634 | 2/2007 |
| JP | A-2007-302873 | 11/2007 |
| JP | A-2007-316448 | 12/2007 |
| JP | A-2008-3569 | 1/2008 |
| JP | A-2008-281974 | 11/2008 |
| JP | A-2008-281980 | 11/2008 |
| JP | A-2009-53657 | 3/2009 |
| JP | A-2009-126940 | 6/2009 |
| JP | A-2009-199061 | 9/2009 |
| JP | A-2010-510541 | 4/2010 |
| JP | A-2010-152292 | 7/2010 |
| JP | A-2011-022560 | 2/2011 |
| WO | WO 2008/063016 A1 | 5/2008 |
| WO | WO 2009/088177 A2 | 7/2009 |
| WO | WO 2010/071155 A1 | 6/2010 |

OTHER PUBLICATIONS

Oct. 15, 2013 Notification of Reasons for Refusal issued in Japanese Application No. 2011-056136 with partial English-language translation.

Jun. 25, 2013 Notification of Reasons for Refusal issued in Japanese Application No. 2011-056136 with partial English-language translation.

Dec. 3, 2013 Taiwanese Office Action issued in Taiwanese Application No. 101108513 with partial English-language translation.

* cited by examiner

Fig. 1(A) Coating a photoresist
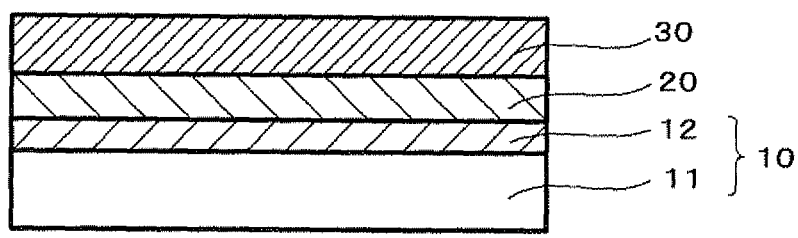
Fig. 1(B) Exposing the photoresist
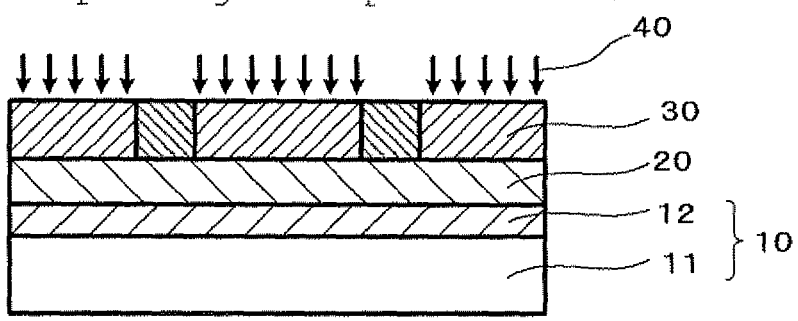
Fig. 1(C) Developing with an organic solvent
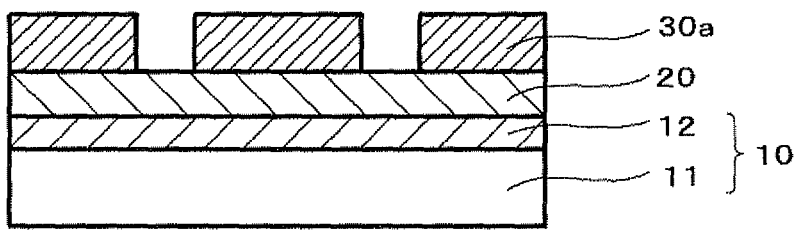

PATTERNING PROCESS AND COMPOSITION FOR FORMING SILICON-CONTAINING FILM USABLE THEREFOR

BACKGROUND OF THE INVENTION

Field of the Invention

The present invention relates to: a patterning process for forming a negative pattern, configured to dissolve an unexposed area after exposure, by development by an organic solvent, while leaving an exposed area without dissolution thereof; and particularly to a patterning process suitable for forming a negative pattern, configured to conduct a deprotection reaction by an acid and a heat after exposure, and to dissolve the unexposed area by development by a specific organic solvent, while leaving an exposed area without dissolution thereof; and a composition for forming silicon-containing film suitable for forming a silicon-containing film, particularly for forming such a film by spin coating, to be used in the process.

In recent years, as LSI progresses toward higher integration and further acceleration in speed, miniaturization of a pattern rule is required. In the light-exposure used as a general technology nowadays, resolution inherent to wavelength of a light source is approaching to its limit. In 1980s, a g-line (436 nm) or an i-line (365 nm) of a mercury lamp was used as an exposure light to be used in a resist pattern forming. As a mean for further miniaturization, a method of shifting to a shorter wavelength of an exposing light was assumed to be effective. As a result, in a mass production process after DRAM (Dynamic Random Access Memory) with 64-megabits (0.25 µm or less of a processing dimension) in 1990s, a KrF excimer laser (248 nm), a shorter wavelength than an i-beam (365 nm), was used in place of an i-line as an exposure light source.

However, in production of DRAM with an integration of 256 M, 1 G and higher which require further miniaturized process technologies (process dimension of 0.2 µm or less), a light source with a further short wavelength is required, and thus a photo lithography using an ArF excimer laser (193 nm) has been investigated seriously since about a decade ago. At first, an ArF lithography was planned to be applied to a device starting from a 180 nm node device, but a KrF excimer laser lithography lived long to a mass production of a 130 nm node device, and thus a full-fledged application of an ArF lithography will start from a 90 nm node.

Further, a study of a 65 nm node device by combining with a lens having an increased NA till 0.9 is now underway. Further shortening of wavelength of an exposure light is progressing towards the next 45 nm node device, and for that an $F_2$ lithography with a 157 nm wavelength became a candidate. However, there are many problems in an $F_2$ lithography; an increase in cost of a scanner due to the use of a large quantity of expensive $CaF_2$ single crystals for a projector lens, extremely poor sustainability of a soft pellicle, which leads to a change of an optical system due to introduction of a hard pellicle, a decrease in an etching resistance of a resist film, and the like. Because of these problems, it was proposed to postpone an $F_2$ lithography and to introduce an ArF immersion lithography earlier.

In the ArF liquid immersion lithography, water having a refractive index of 1.44 is inserted between the projection lens and a wafer by a partial filling manner to enable high-speed scanning, thereby allowing to conduct mass-production of 45 nm node devices by a lens having an NA on the order of 1.3.

Exemplary candidates of lithography techniques for 32 nm nodes include extreme ultraviolet (EUV) lithography at a wavelength of 13.5 nm. Then, exemplary objects accompanying to the EUV lithography are to increase an output of laser, enhance a sensitivity of resist film, enhance a resolution, decrease a line width roughness (LWR), achieve a defect-free MoSi laminate mask, lower aberrations of a reflecting mirror, for example, thereby leaving a pile of objects to be attained.

Another candidate of 32 nm nodes is a high refractive index liquid immersion lithography, the development of which has been abandoned, due to lower transmittance of LuAG as a candidate of high refractive index lens therefor, and due to failure of achievement of a refractive index of a liquid to be increased up to a targeted value of 1.8.

Under such circumstances, attention has been again directed to organic solvent-based development. This is to form a negative pattern by organic solvent-based development of an adopted positive resist composition having a higher resolution, so as to resolve an extremely fine hole pattern by virtue of exposure in a negative tone, which hole pattern is not attained in a positive tone. Further progressed is an investigation to obtain a two-fold finer resolving power, by mutually combining two times of development comprising an alkaline development and the organic solvent-based development.

Usable as an ArF resist composition for development in a negative tone by an organic solvent, is a positive ArF resist composition of a conventional type, and examples of patterning processes therefor are shown in Japanese Patent Laid-Open (kokai) No. 2008-281974, Japanese Patent Laid-Open (kokai) No. 2008-281980, Japanese Patent Laid-Open (kokai) No. 2009-53657, for example.

Proposed in the patent applications according to the above-noted Patent Documents, are resist compositions for organic solvent-based development, and patterning processes therefor, respectively, where the resist compositions are obtained by: copolymerization including hydroxyadamantane methacrylate; copolymerization including norbornanelactone methacrylate; or copolymerization of a methacrylate having acidic groups such as a carboxyl group, sulfo group, phenol group, thiol group, or the like substituted by two or more kinds of acid labile groups, with a methacrylate having an ester of cyclic acid stable group.

As one method to transfer the thus formed pattern to a substrate, multi-layer resist process have been used. The methods are configured to: interpose an intermediate film, for example a resist underlayer film containing silicon atom, having an etching selectivity different from that of a photoresist film, i.e., a resist upper layer film, between the resist upper layer film and a processing substrate; obtain a pattern in the resist upper layer film; thereafter transfer the pattern to the resist underlayer film by dry etching by using the obtained resist upper layer film pattern as a dry etching mask; and further transfer the pattern onto the processing substrate by dry etching by using the obtained pattern of the underlayer film as a dry etching mask.

Examples of silicon-containing resist underlayer films to be used in the above-described multi-layer resist process include silicon-containing inorganic films by CVD, such as $SiO_2$ films (Japanese Patent Laid-Open (kokai) No. H7-183194, for example) and SiON films (Japanese Patent Laid-Open (kokai) No. H7-181688, for example); and films obtained by spin coating, such as SOG (spin-on-glass) films (Japanese Patent Laid-Open (kokai) No. 2007-302873, for example), and crosslinkable silsesquioxane films (Japanese translation of PCT international application No. 2005-520354, for example).

SUMMARY OF THE INVENTION

However, in case of a patterning process of a negative resist adopting such organic solvent-based development, it has been likely that a performance of a resist upper layer is not sufficiently exhibited in a patterning process adopting a conventional lower layer film material or the like.

The present invention has been carried out in view of the above circumstances, and it is therefore an object of the present invention to provide a patterning process, which is optimum as a patterning process of a negative resist pattern to be formed by adopting organic solvent-based development, and a composition for forming silicon-containing film to be used in the process.

In order to solve the foregoing problems, the present invention provides a patterning process for forming a negative pattern by lithography, comprising at least the steps of:

using a composition for forming silicon-containing film, containing a silicon-containing compound (A) and an organic solvent (B), to form a silicon-containing film;

wherein the silicon-containing compound (A) is obtained by hydrolytically condensing a mixture comprising: one or more kinds selected from a hydrolyzable silicon compound represented by the following general formula (A-1), a hydrolyzate of the compound, a condensate of the compound, and a hydrolysis condensate of the compound; and one or more kinds of compounds each selected from a group consisting of a hydrolyzable silicon compound represented by the following general formula (A-2-1), a hydrolyzate of the compound, a condensate of the compound, a hydrolysis condensate of the compound, a reactive compound represented by the following general formula (A-2-2), a hydrolyzate of the compound, a condensate of the compound, and a hydrolysis condensate of the compound,

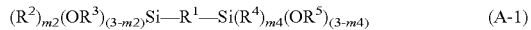

$(R^2)_{m2}(OR^3)_{(3-m2)}Si-R^1-Si(R^4)_{m4}(OR^5)_{(3-m4)}$ (A-1)

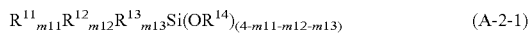

$R^{11}{}_{m11}R^{12}{}_{m12}R^{13}{}_{m13}Si(OR^{14})_{(4-m11-m12-m13)}$ (A-2-1)

$U(OR^{21})_{m21}(OR^{22})_{m22}(O)_{m23/2}$ (A-2-2), wherein $R^1$ represents a single bond, or a divalent organic group having 1 to 20 carbon atoms, each $R^2$ and $R^4$ independently represent a hydrogen atom, or a monovalent organic group having 1 to 20 carbon atoms, each $R^3$ and $R^5$ independently represent a hydrogen atom, or an alkyl group having 1 to 6 carbon atoms, and m2 and m4 represent integers satisfying that $0 \leq m2+m4 \leq 2$;

each $R^{11}$, $R^{12}$, and $R^{13}$ independently represent a hydrogen atom, or a monovalent organic group having 1 to 30 carbon atoms, each m11, m12, and m13 independently represent 0 or 1, and satisfy that $0 \leq m11+m12+m13 \leq 3$, and $R^{14}$ represents a hydrogen atom, or an alkyl group having 1 to 6 carbon atoms; and each $R^{21}$ and $R^{22}$ independently represent a hydrogen atom, or an organic group having 1 to 30 carbon atoms, m21+m22+m23/2 represents a valence to be determined by a kind of U, each m21, m22, and m23 independently represent an integer of 0 or more, and U represents one of elements belonging to the III group, IV group, and V group in the periodic table, except for carbon and silicon;

using a silicon-free resist composition to form a photoresist film on the silicon-containing film;

heat-treating the photoresist film, and subsequently exposing the photoresist film to a high energy beam; and using a developer comprising an organic solvent to dissolve an unexposed area of the photoresist film, thereby obtaining a negative pattern.

According to such a process, it is possible to obtain a pattern, which pattern is excellent in adhesion to a resist pattern in a line shape obtained by negative development, which pattern also keeps its profile shape rectangular, and which pattern is excellent in roughness, i.e., so-called LWR, at a resist-side surface. Also, when the pattern is a hole pattern, the pattern can be formed to be excellent in circularity such that the pattern is free of scums, footings, and the like even at a bottom portion of a hole.

In the patterning process of the present invention, the used composition for forming silicon-containing film can further contain:

(C) one or more kinds of compounds each represented by the following general formula (3) or general formula (4),

$L_aH_bX$ (3), wherein

L represents a cation of an element belonging to the 1a group of the periodic table, X represents one of a hydroxide ion, and a monovalent or di- or more valent organic acid ion having 1 to 30 carbon atoms, which acid ion may be substituted with a halogen atom, phosphoric acid ion, nitric acid ion, or carbonic acid ion, a represents an integer of 1 or more, b represents an integer of 0, 1, or more, and a+b represents a valence to be determined by the X, and

$M_{a'}H_{b'}A$ (4), wherein

M represents a sulfonium, iodonium, or ammonium,

A represents one of a hydroxide ion, and a monovalent or di- or more valent organic acid ion having 1 to 30 carbon atoms, which acid ion may be substituted with a halogen atom, phosphoric acid ion, nitric acid ion, or carbonic acid ion, or a halogen ion, or a halogen acid ion, a' represents an integer of 1 or more, b' represents an integer of 0, 1, or more, and a'+b' represents a valence to be determined by the A; and (D) a monovalent or di- or more valent organic acid having 1 to 30 carbon atoms.

Using the composition containing the components (C) and (D) enables to provide such a patterning process for forming a pattern, which is not only excellent in adhesion to a resist pattern after development, but also less in timewise change.

Further, in the used composition for forming silicon-containing film, the M in the general formula (4) can be a tertiary sulfonium, secondary iodonium, or quaternary ammonium.

In this way, when the cured film is formed by adopting the composition including such compounds it becomes possible to provide a film which has been progressed in cross-linking. Thus, active constituents in the photoresist film are prevented from migrating to the silicon-containing film, thereby allowing to provide a method for forming a pattern with a lithography performance at the same level as typical organic anti-reflective films.

Further, it is preferable that in the used composition for forming silicon-containing film, the U in the general formula (A-2-2) is boron, aluminum, gallium, yttrium, germanium, titanium, zirconium, hafnium, bismuth, tin, phosphorus, vanadium, arsenic, antimony, niobium, or tantalum.

Using the patterning process of the present invention, the silicon-containing film including the element represented by the U can form a pattern with faster etching speed than that of a silicon-containing film without containing the U, and is capable of forming a less roughness pattern.

In addition, it is preferable that the used composition for forming silicon-containing film is configured to form the silicon-containing film having a contact angle between 20° inclusive and 70° exclusive relative to pure water.

In case of the patterning process of the present invention configured to use the developer comprising the organic solvent to dissolve an unexposed area to thereby obtain a negative pattern while leaving the exposed area without dissolution thereof, the resist at the exposed area has been turned into a polymer structure, which structure has lost an acid leaving group by virtue of an acid generated by an acid generator, and therefore contains a hydrophilic carboxyl group, a phenolic hydroxyl group, and the like, such that the resist has a contact angle of about 50° relative to pure water. The silicon-containing lower layer film is made to have a contact angle approaching that of such a resist pattern, thereby enabling to form a pattern further improved in adhesion without collapse.

The patterning process of the photoresist film may be conducted as pattern formation based on photolithography at a wavelength between 10 nm inclusive and 300 nm inclusive, direct writing by electron beam, or nano-imprinting, or any combination thereof.

In case of adopting the patterning process of the present invention, when forming a negative pattern by patterning the resist upper layer in this way, a negative pattern can be formed with the same performance as a conventional positive pattern.

In addition, it is preferable that the used developer contains, as a developer component, one or more kinds selected from 2-octanone, 2-nonanone, 2-heptanone, 3-heptanone, 4-heptanone, 2-hexanone, 3-hexanone, diisobutylketone, methylcyclohexanone, acetophenone, methylacetophenone, propyl acetate, butyl acetate, isobutyl acetate, amyl acetate, butenyl acetate, isoamyl acetate, phenyl acetate, propyl formate, butyl formate, isobutyl formate, amyl formate, isoamyl formate, methyl valerate, methyl pentenoate, methyl crotonate, ethyl crotonate, methyl lactate, ethyl lactate, propyl lactate, butyl lactate, isobutyl lactate, amyl lactate, isoamyl lactate, methyl 2-hydroxy-isobutyrate, ethyl 2-hydroxy-isobutyrate, methyl benzoate, ethyl benzoate, phenyl acetate, benzyl acetate, methyl phenylacetate, benzyl formate, phenylethyl formate, methyl 3-phenyl-propionate, benzyl propionate, ethyl phenylacetate, and acetic acid 2-phenylethyl. In this case, it is preferable that the used developer contains one kind, or two or more kinds of the developer components, in a total amount of 50 wt % or more in particular.

Using the developer containing such components enables to form a line pattern without pattern collapse, and a hole pattern excellent in circularity.

Further, in present invention, the step of forming the silicon-containing film can comprise the step of forming the silicon-containing film on an organic lower layer film or an organic hard mask, after forming the organic lower layer film or the organic hard mask on a process-targeted workpiece.

The patterning process can further comprise the steps of: after obtaining the negative pattern, using the photoresist film as a mask formed with the pattern, to transfer the pattern to the silicon-containing film by dry etching;

using the silicon-containing film as a mask having the pattern transferred thereto, to transfer the pattern to the organic lower layer film or the organic hard mask by dry etching; and using the organic lower layer film or the organic hard mask as a mask having the pattern transferred thereto, to transfer the pattern to the process-targeted workpiece by dry etching.

According to the patterning process of the present invention, by optimizing the combination of the organic lower layer film by coating, the organic hard mask by a CVD method, or the like as described above, the pattern formed in the resist upper layer can be formed on a substrate without causing a size conversion difference.

In present invention, the process-targeted workpiece comprising a semiconductor substrate formed thereon with a metal film, metal carbide film, metal oxide film, metal nitride film, or metal oxide nitride film can be used.

Further, in present invention, the process-targeted workpiece being configured with a metal which is one of silicon, titanium, tungsten, hafnium, zirconium, chromium, germanium, copper, aluminum, iron, and an alloy thereof can be used.

Using the patterning process of the present invention enables to form a pattern, by processing a process-targeted workpiece as noted above.

In addition, present invention provides a composition for forming silicon-containing film to be formed in a multi-layer resist method used in lithography, the composition containing, at least, a silicon-containing compound (A) and an organic solvent (B);

wherein the silicon-containing compound (A) is obtained by hydrolytically condensing a mixture comprising: one or more kinds selected from a hydrolyzable silicon compound represented by the following general formula (A-1), a hydrolyzate of the compound, a condensate of the compound, and a hydrolysis condensate of the compound; and one or more kinds of compounds each selected from a group consisting of a hydrolyzable silicon compound represented by the following general formula (A-2-1), a hydrolyzate of the compound, a condensate of the compound, a hydrolysis condensate of the compound, a reactive compound represented by the following general formula (A-2-2), a hydrolyzate of the compound, a condensate of the compound, and a hydrolysis condensate of the compound,

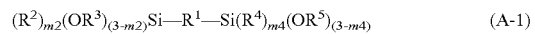
$$(R^2)_{m2}(OR^3)_{(3-m2)}Si-R^1-Si(R^4)_{m4}(OR^5)_{(3-m4)} \quad (A-1)$$

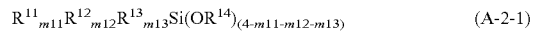
$$R^{11}{}_{m11}R^{12}{}_{m12}R^{13}{}_{m13}Si(OR^{14})_{(4-m11-m12-m13)} \quad (A-2-1)$$

$$U(OR^{21})_{m21}(OR^{22})_{m22}(O)_{m23/2} \quad (A-2-2),$$

wherein
$R^1$ represents a single bond, or a divalent organic group having 1 to 20 carbon atoms, each $R^2$ and $R^4$ independently represent a hydrogen atom, or a monovalent organic group having 1 to 20 carbon atoms, each $R^3$ and $R^5$ independently represent a hydrogen atom, or an alkyl group having 1 to 6 carbon atoms, and m2 and m4 represent integers satisfying that $0 \leq m2+m4 \leq 2$;

each $R^{11}$, $R^{12}$, and $R^{13}$ independently represent a hydrogen atom, or a monovalent organic group having 1 to 30 carbon atoms, each m11, m12, and m13 independently represent 0 or 1, and satisfy that $0 \leq m11+m12+m13 \leq 3$, and $R^{14}$ represents a hydrogen atom, or an alkyl group having 1 to 6 carbon atoms; and each $R^{21}$ and $R^{22}$ independently represent a hydrogen atom, or an organic group having 1 to 30 carbon atoms, m21+m22+m23/2 represents a valence to be determined by a kind of U, each m21, m22, and m23 independently represent an integer of 0 or more, and U represents one of elements belonging to the III group, IV group, and V group in the periodic table, except for carbon and silicon.

According to such a composition, it is possible to obtain a pattern, which pattern is excellent in adhesion to a resist pattern in a line shape obtained by negative development, and which pattern is excellent.

In addition, it is preferable that the composition for forming silicon-containing film further contains:

(C) one or more kinds of compounds each represented by the following general formula (3) or general formula (4),

$$L_a H_b X \tag{3}$$

wherein

L represents a cation of an element belonging to the 1a group of the periodic table, X represents one of a hydroxide ion, and a monovalent or di- or more valent organic acid ion having 1 to 30 carbon atoms, which acid ion may be substituted with a halogen atom, phosphoric acid ion, nitric acid ion, or carbonic acid ion, a represents an integer of 1 or more, b represents an integer of 0, 1, or more, and a+b is a valence to be determined by the X, and

$$M_{a'} H_{b'} A \tag{4}$$

wherein

M represents a sulfonium, iodonium, or ammonium,

A represents one of a hydroxide ion, and a monovalent or di- or more valent organic acid ion having 1 to 30 carbon atoms, which acid ion may be substituted with a halogen atom, phosphoric acid ion, nitric acid ion, or carbonic acid ion, or a halogen ion, or a halogen acid ion, a' represents an integer of 1 or more, b' represents an integer of 0, 1, or more, and a'+b' represents a valence to be determined by the A; and (D) a monovalent or di- or more valent organic acid having 1 to 30 carbon atoms.

According to the composition containing the components (C) and (D) enables to be a pattern, which is not only excellent in adhesion to a resist pattern after development, but also less in timewise change Further, it is preferable that the M in the general formula (4) is a tertiary sulfonium, secondary iodonium, or quaternary ammonium.

In this way, when the cured film is formed by adopting the composition including such compounds, it becomes possible to provide a film which has been progressed in cross-linking. Thus, active constituents in the photoresist film are prevented from migrating to the silicon-containing film, thereby allowing to form a pattern with a lithography performance at the same level as typical organic antireflective films.

In addition, it is preferable that the U in the general formula (A-2-2) is boron, aluminum, gallium, yttrium, germanium, titanium, zirconium, hafnium, bismuth, tin, phosphorus, vanadium, arsenic, antimony, niobium, or tantalum.

The silicon-containing film including the element represented by the U can form a pattern with faster etching speed than that of a silicon-containing film without containing the U, and is capable of forming a less roughness pattern.

Further, it is preferable that the composition for forming silicon-containing film is configured to provide a film to be obtained by coating the composition onto a process-targeted workpiece and by firing the coated composition, such that the film has a contact angle between 20° inclusive and 70° exclusive relative to pure water.

Such a composition for forming a silicon-containing film configured to have such a contact angle, enables to form a pattern, which is further improved in adhesion to a resist pattern and which is free of collapse.

As explained above, using the silicon-containing film formed by adopting the composition for forming silicon-containing film of the present invention, it is enables to form an excellent pattern of a photoresist film formed on the silicon-containing film. Further, since a higher etching selectivity can be then obtained relative to an organic material, the formed photoresist pattern can be sequentially transferred into the silicon-containing film and into an organic lower layer film by a dry etching process. Particularly, although pattern transference into a conventional silicon-containing film is made to be difficult due to a decreased film thickness of photoresist as the semiconductor process is progressed to be finer, adoption of the composition for forming silicon-containing film of the present invention enables to utilize even a photoresist decreased in film thickness as an etching mask, to restrict deformation of a photoresist pattern during dry etching, thereby transferring the pattern onto a substrate with a higher precision.

BRIEF DESCRIPTION OF THE DRAWINGS

FIG. 1 is an explanatory view showing one embodiment of a patterning process according to the present invention.

DETAILED DESCRIPTION OF THE PREFERRED EMBODIMENTS

The present invention will be explained hereinafter.

As described above, in case of forming a negative resist pattern by using a developer comprising an organic solvent, it has been likely that a performance of a resist upper layer is not sufficiently exhibited in a patterning process adopting a conventional lower layer film material or the like.

As such, the present inventors have earnestly investigated patterning processes each configured to use a developer comprising an organic solvent to dissolve an unexposed area to obtain a negative pattern while leaving an exposed area without dissolution thereof, and have found out that, by using a composition for forming silicon-containing film containing a silicon-containing compound to be obtained by hydrolytically condensing a certain specific hydrolyzable silicon compound, it is enabled to obtain a pattern in the silicon-containing film, which pattern is excellent in reproducibility of a resist pattern to be obtained by the organic solvent-based development, excellent in adhesion to the resist pattern, excellent in resistance against the organic solvent to be used as the developer, and also excellent in pattern roughness, thereby narrowly reaching completion of the present invention.

The silicon-containing compound (A), in the composition for forming silicon-containing film of the present invention used in the patterning process of the present invention, is obtained by hydrolytically condensing a mixture comprising: one or more kinds selected from a hydrolyzable silicon compound represented by the following general formula (A-1), a hydrolyzate of the compound, a condensate of the compound, and a hydrolysis condensate of the compound; and one or more kinds of compounds each selected from a group consisting of a hydrolyzable silicon compound represented by the following general formula (A-2-1), a hydrolyzate of the compound, a condensate of the compound, a hydrolysis condensate of the compound, a reactive compound represented by the following general formula (A-2-2), a hydrolyzate of the compound, a condensate of the compound, and a hydrolysis condensate of the compound,

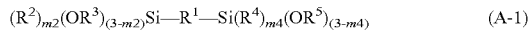

(A-1)

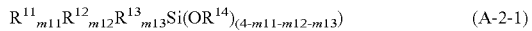

(A-2-1)

$$U(OR^{21})_{m21}(OR^{22})_{m22}(O)_{m23/2}$$ (A-2-2), wherein $R^1$ represents a single bond, or a divalent organic group having 1 to 20 carbon atoms, each $R^2$ and $R^4$ independently represent a hydrogen atom, or a monovalent organic group having 1 to 20 carbon atoms, each $R^3$ and $R^5$ independently represent a hydrogen atom, or an alkyl group having 1 to 6 carbon atoms, and m2 and m4 represent integers satisfying that $0 \le m2+m4 \le 2$;

each $R^{11}$, $R^{12}$, and $R^{13}$ independently represent a hydrogen atom, or a monovalent organic group having 1 to 30 carbon atoms, each m11, m12, and m13 independently represent 0 or 1, and satisfy that $0 \le m11+m12+m13 \le 3$, and $R^{14}$ represents a hydrogen atom, or an alkyl group having 1 to 6 carbon atoms; and each $R^{21}$ and $R^{22}$ independently represent a hydrogen atom, or an organic group having 1 to 30 carbon atoms, m21+m22+m23/2 represents a valence to be determined by a kind of U, each m21, m22, and m23 independently represent an integer of 0 or more, and U represents one of elements belonging to the III group, IV group, and V group in the periodic table, except for carbon and silicon.

According to the present invention, by using the silicon-containing film to be obtained from the composition containing the silicon-containing compound comprising such a specific silane compound as represented by the general formula (A-1), it is enabled to exemplarily obtain a pattern, which pattern is excellent in adhesion to a resist pattern in a line shape obtained by negative development, which pattern also keeps its profile shape rectangular, and which pattern is excellent in roughness, i.e., so-called LWR, at a resist-side surface. Further, it is also possible to form a hole pattern, which is excellent in circularity such that the pattern is free of scums, footings, and the like even at a bottom portion of a hole.

Generally, when water is caused to act on a hydrolyzable silicon compound in the presence of an acid catalyst, hydrolyzable substitutional groups bonded to a silicon atom of the compound are subjected to hydrolysis, thereby forming reactive end groups. The reactive end groups are further each subjected to a condensation reaction with another reactive end group or an unreacted hydrolyzable group, to thereby form a siloxane bond, or the like. This reaction is then repeatedly caused, to successively form a so-called oligomer, a polymer, and a silicon-containing compound called a sol as the case may be. At this time, the condensation reaction is progressed sequentially from the most reactive end groups among those derived from monomers, oligomers, polymers, and the like generated in the system by the hydrolytic condensation reaction, in a manner to consume the reactive end groups belonging to the monomers, oligomers, polymers, and the like, thereby forming a silicon-containing compound. Further, this condensation reaction is progressed endlessly, and occasionally progressed to such an extent to finally bring a solution containing the silicon-containing compound into a gel. In such a situation, fluctuation of film thickness, fluctuation in lithography performance, and the like are observed. Particularly, since fluctuation of lithography performance is so influencing, condensation of silanol groups in molecules is caused to be observed as a fluctuation of a highly fine pattern shape, even when such condensation is not observed as an increased film thickness, a fluctuation of molecular weight, or the like. At this time, it is frequent that silanol groups, which are relatively low in reactivity, are finally left as reactive end groups, respectively.

Particularly, since the silicon-containing compound represented by the general formula (A-1) is difficult to be completely condensed even under a temperature condition upon forming a silicon-containing film, the silicon-containing film includes more silanols at its surface, than a film provided by a composition for forming silicon-containing film without containing such a silicon compound.

Exemplarily considering a reaction between monomers, or between a reactive end of a polymer and a monomer, as an example, in case of a hydrolytic condensation of each of a bifunctional silane without restriction, a bifunctional silane unit, which has one bond subjected to restriction and which is thus unable to freely rotate, and a trifunctional silane, although the rotation of a silicon atom is subjected to restriction by a siloxane bond(s) as the condensation is progressed as shown below, it is possible for the applicable silane to be condensed with a silanol present around it even upon formation of the final siloxane bond:

in case of bifunctional silane without restriction:

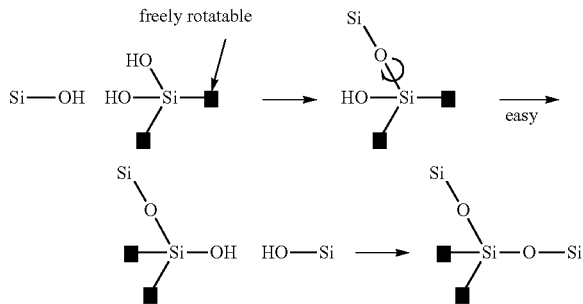

in case of bifunctional silane which has one bond subjected to restriction and which is thus unable to freely rotate:

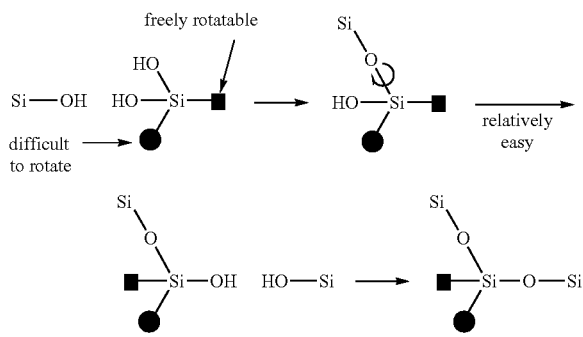

in case of trifunctional silane:

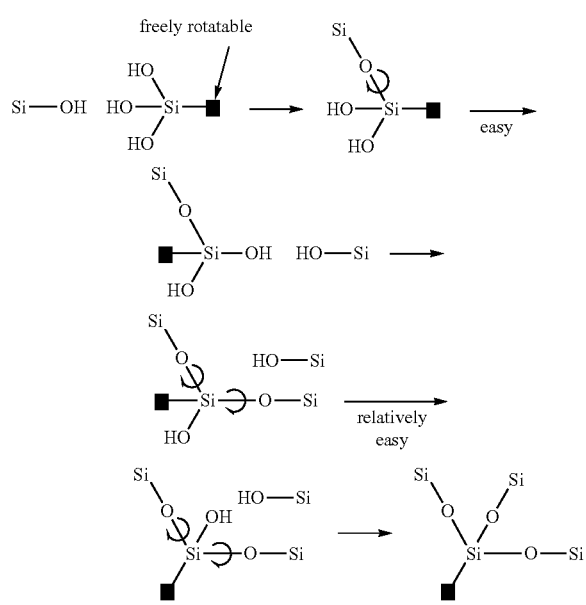

In turn, in case of a trifunctional silane, which has one bond subjected to restriction and which is thus unable to freely rotate, and a tetrafunctional silane, although it is relatively easy to form each siloxane bond until the penultimate one as shown below, the last siloxane bond is not formed unless an extremely large energy is provided because the rotation of the silicon atom is subjected to strong restriction by the previous siloxane bonds. Still more, in each case of a pentafunctional silane and a hexafunctional silane, the number of silanol groups bonded to the applicable monomer itself is large, so that completion of condensation is not achieved, and many silanols are generated in the resultant polymer.

in case of trifunctional silane which has one bond subjected to restriction and which is thus unable to freely rotate:

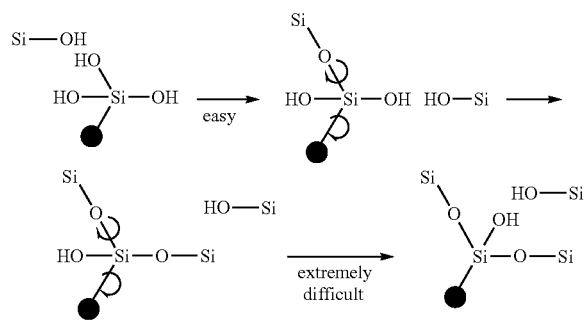

in case of tetrafunctional silane:

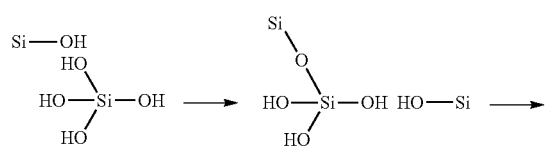

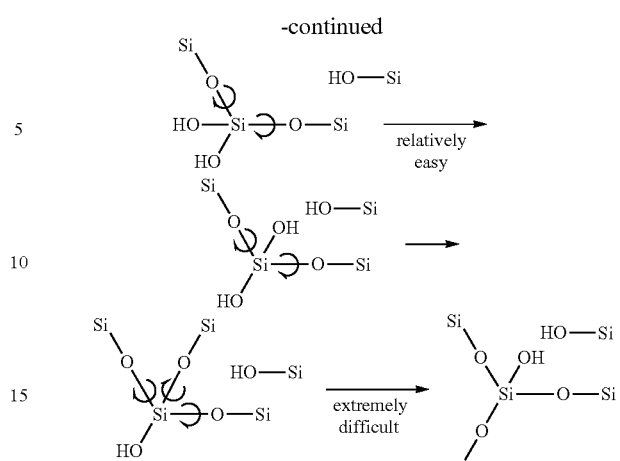

The resist pattern obtained by negative development is a polymer, which is high in concentration of contained hydrophilic groups such as carboxylic acids each having lost a protective group. As such, in the patterning process of the present invention, an interaction by virtue of hydrogen bond is effected between a silanol of a silicon-containing film comprising the composition for forming silicon-containing film of the present invention, and a carboxylic acid or the like, thereby improving adhesion of the film to the pattern, without pattern collapse even for a thin-line pattern.

In this case, the resist at the exposed area has been turned into a polymer structure, which structure has lost an acid leaving group by virtue of an acid generated by an acid generator, and which structure contains a hydrophilic carboxyl group, a phenolic hydroxyl group, and the like, such that the resist has been turned to have a contact angle of about 50° relative to pure water. Thus, by using, for such a resist pattern, the composition for forming silicon-containing film configured to provide a silicon-containing film having a contact angle between 20° inclusive and 70° exclusive relative to pure water, to approach a contact angle of the silicon-containing film to that of such a resist pattern, it is allowed to further improve the adhesion therebetween.

It is noted here that the hydrolyzates, condensates, and hydrolysis condensates in the component (A) of the present invention mean that such substances may be: in addition to those compounds (A-1), (A-2-1), and (A-2-2) constituting the component (A), all the reactive end groups of which compounds have been hydrolyzed, for example; those compounds, only one of reactive end groups of each of which has been hydrolyzed, for example; those compounds, two or more of reactive end groups of each of which have been hydrolyzed, for example; and a mixture of those compounds, the degrees of hydrolysis or the like of which are different; and the like.

In addition, the term "organic group" means a group, which includes carbon, and which may additionally include hydrogen, as well as nitrogen, oxygen, sulfur, silicon or the like. Examples of the organic groups include: unsubstituted monovalent hydrocarbon groups, such as linear, branched or cyclic alkyl, alkenyl, alkynyl, aryl and aralkyl groups; substituted groups, which one or more hydrogen atoms of the above groups are substituted with an epoxy group, alkoxy group, hydroxy group, or the like; groups including intervening groups such as —O—, —CO—, —COO—, —COO—, or —OCOO—; and organic groups including a silicon-silicon bond.

Examples of the compound represented by the general formula (A-1) are shown below.
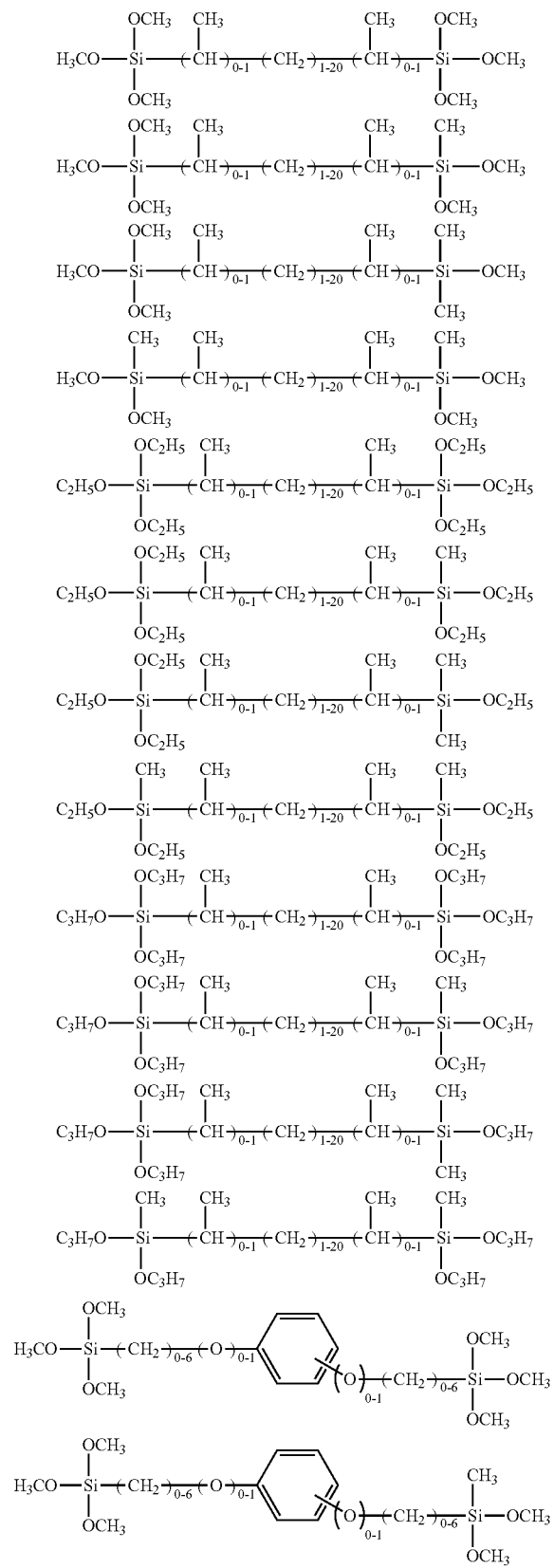
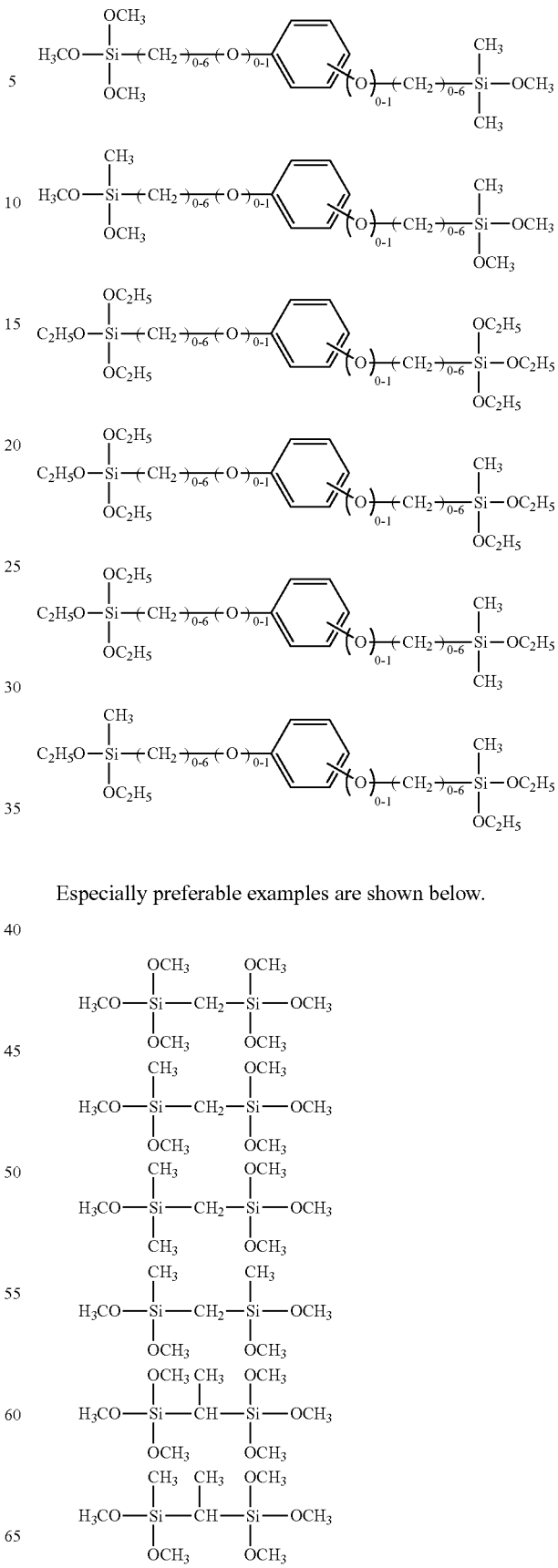
Especially preferable examples are shown below.

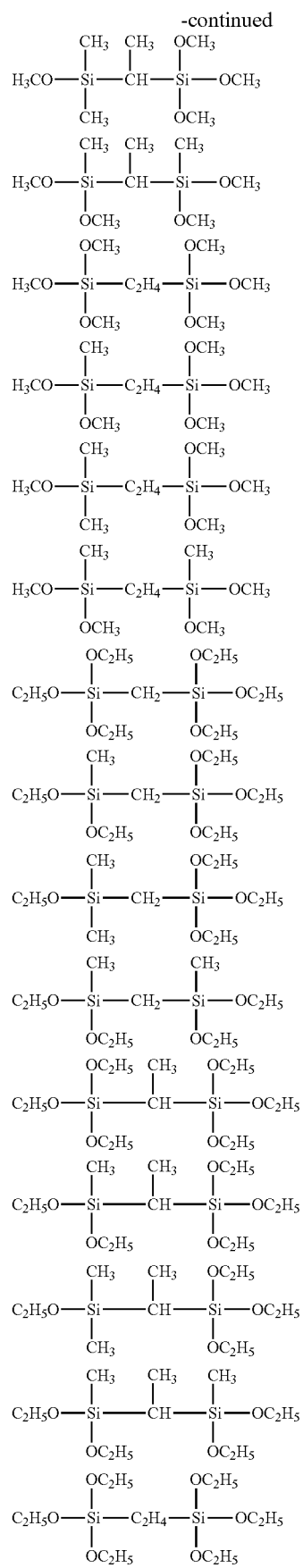
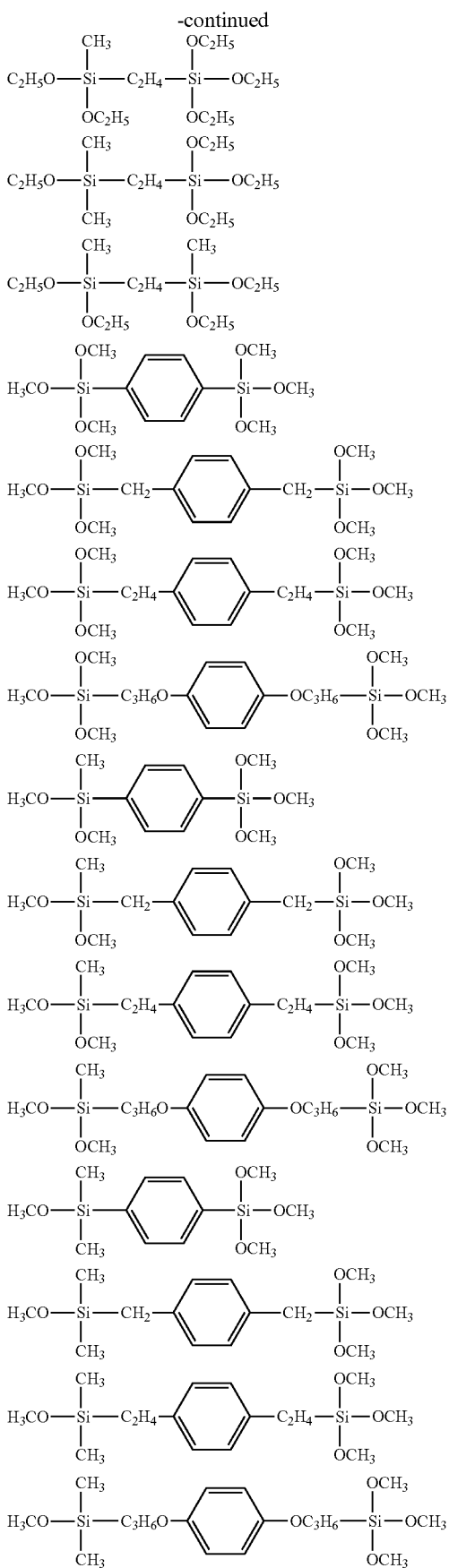

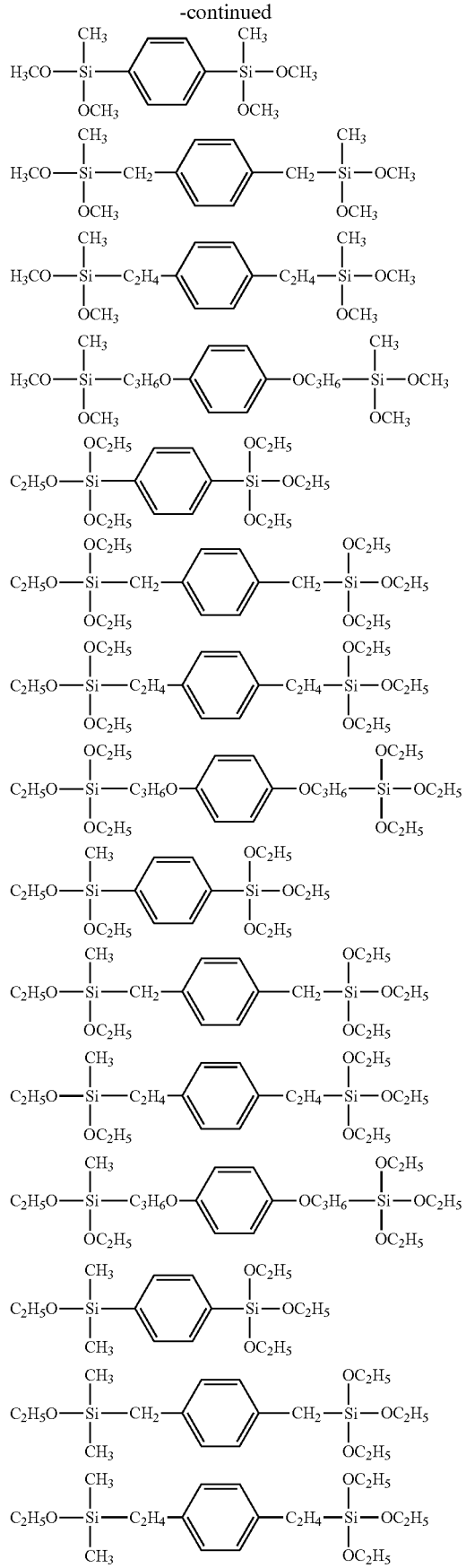

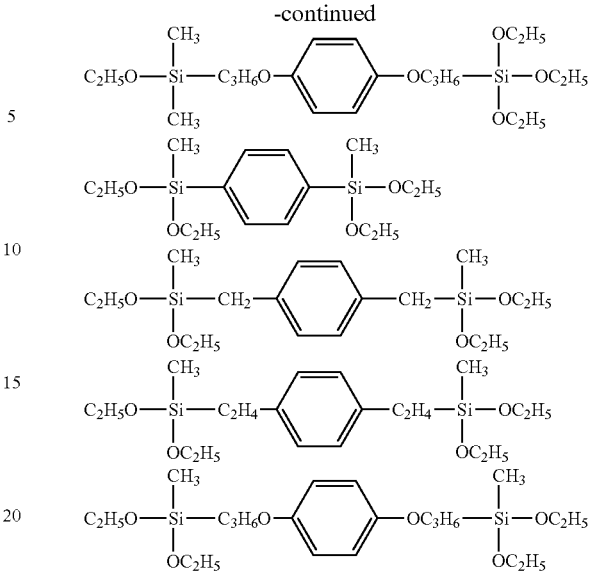

The compounds represented by the general formula (A-2-1) may be shown below, but the compounds are not restricted to these compounds.

Examples of tetraalkoxysilanes which satisfy m11+m12+m13=0 include tetramethoxysilane, tetraethoxysilane, tetrapropoxysilane, and tetraisopropoxysilane and the like.

Examples of trialkoxysilanes which satisfy m11+m12+m13=1 include trimethoxysilane, triethoxysilane, tripropoxysilane, triisopropoxysilane, methyltrimethoxysilane, methyltriethoxysilane, methyltripropoxysilane, methyltriisopropoxysilane, ethyltrimethoxysilane, ethyltriethoxysilane, ethyltripropoxysilane, ethyltriisopropoxysilane, vinyltrimethoxysilane, vinyltriethoxysilane, vinyltripropoxysilane, vinyltriisopropoxysilane, propyltrimethoxysilane, propyltriethoxysilane, propyltripropoxysilane, propyltriisopropoxysilane, isopropyltrimethoxysilane, isopropyltriethoxysilane, isopropyltripropoxysilane, isopropyltriisopropoxysilane, butyltrimethoxysilane, butyltriethoxysilane, butyltripropoxysilane, butyltriisopropoxysilane, sec-butyltrimethoxysilane, sec-butyltriethoxysilane, sec-butyltripropoxysilane, sec-butyltriisopropoxysilane, t-butyltrimethoxysilane, t-butyltriethoxysilane, t-butyltripropoxysilane, t-butyltriisopropoxysilane, cyclopropyltrimethoxysilane, cyclopropyltriethoxysilane, cyclopropyltripropoxysilane, cyclopropyltriisopropoxysilane, cyclobutyltrimethoxysilane, cyclobutyltriethoxysilane, cyclobutyltripropoxysilane, cyclobutyltriisopropoxysilane, cyclopentyltrimethoxysilane, cyclopentyltriethoxysilane, cyclopentyltripropoxysilane, cyclopentyltriisopropoxysilane, cyclohexyltrimethoxysilane, cyclohexyltriethoxysilane, cyclohexyltripropoxysilane, cyclohexyltriisopropoxysilane, cyclohexenyltrimethoxysilane, cyclohexenyltriethoxysilane, cyclohexenyltripropoxysilane, cyclohexenyltriisopropoxysilane, cyclohexenylethyltrimethoxysilane, cyclohexenylethyltriethoxysilane, cyclohexenylethyltripropoxysilane, cyclohexenylethyltriisopropoxysilane, cyclooctyltrimethoxysilane, cyclooctyltriethoxysilane, cyclooctyltripropoxysilane, cyclooctyltriisopropoxysilane, cyclopentadienylpropyltrimethoxysilane, cyclopentadienylpropyltriethoxysilane, cyclopentadienylpropyltripropoxysilane, cyclopentadienylpropyltriisopropoxysilane, bicycloheptenyltrimethoxysilane, bicycloheptenyltriethoxysilane, bicycloheptenyltripropoxysilane, bicycloheptenyltriisopropoxysilane, bicycloheptyltrimethoxysilane, bicycloheptyltriethoxysilane, bicycloheptyltripropoxysilane, bicycloheptyltriisopropoxysilane, adamantyltrimethoxysilane, adamantyltriethoxysilane, adamantyltripropoxysilane, adamantyltriisopropoxysilane, phenyltrimethoxysilane, phenyltriethoxysilane, phenyltripropoxysilane, phenyltriisopropoxysilane, benzyltrimethoxysilane, benzyltriethoxysilane, benzyltripropoxysilane, benzyltriisopropoxysilane, tolyltrimethoxysilane, tolyltriethoxysilane, tolyltripropoxysilane, tolyltriisopropoxysilane, phenethyltrimethoxysilane, phenethyltriethoxysilane, phenethyltripropoxysilane, phenethyltriisopropoxysilane, naphthyltrimethoxysilane, naphthyltriethoxysilane, naphthyltripropoxysilane, and naphthyltriisopropoxysilane.

Examples of dialkoxysilanes which satisfy m11+m12+m13=2 include dimethyldimethoxysilane, dimethyldiethoxysilane, methylethyldimethoxysilane, methylethyldiethoxysilane, dimethyldipropoxysilane, dimethyldiisopropoxysilane, diethyldimethoxysilane, diethyldiethoxysilane, diethyldipropoxysilane, diethyldiisopropoxysilane, dipropyldimethoxysilane, dipropyldiethoxysilane, dipropyldipropoxysilane, dipropyldiisopropoxysilane, diisopropyldimethoxysilane, diisopropyldiethoxysilane, diisopropyldipropoxysilane, diisopropyldiisopropoxysilane, dibutyldimethoxysilane, dibutyldiethoxysilane, dibutyldipropoxysilane, dibutyldiisopropoxysilane, di-sec-butyldimethoxysilane, di-sec-butyldiethoxysilane, di-sec-butyldipropoxysilane, di-sec-butyldiisopropoxysilane, di-t-butyldimethoxysilane, di-t-butyldiethoxysilane, di-t-butyldipropoxysilane, di-t-butyldiisopropoxysilane, dicyclopropyldimethoxysilane, dicyclopropyldiethoxysilane, dicyclopropyldipropoxysilane, dicyclopropyldiisopropoxysilane, dicyclobutyldimethoxysilane, dicyclobutyldiethoxysilane, dicyclobutyldipropoxysilane, dicyclobutyldiisopropoxysilane, dicyclopentyldimethoxysilane, dicyclopentyldiethoxysilane, dicyclopentyldipropoxysilane, dicyclopentyldiisopropoxysilane, dicyclohexyldimethoxysilane, dicyclohexyldiethoxysilane, dicyclohexyldipropoxysilane, dicyclohexyldiisopropoxysilane, dicyclohexenyldimethoxysilane, dicyclohexenyldiethoxysilane, dicyclohexenyldipropoxysilane, dicyclohexenyldiisopropoxysilane, dicyclohexenylethyldimethoxysilane, dicyclohexenylethyldiethoxysilane, dicyclohexenylethyldipropoxysilane, dicyclohexenylethyldiisopropoxysilane, dicyclooctyldimethoxysilane, dicyclooctyldiethoxysilane, dicyclooctyldipropoxysilane, dicyclooctyldiisopropoxysilane, dicyclopentadienylpropyldimethoxysilane, dicyclopentadienyipropyldiethoxysilane, dicyclopentadienylpropyldipropoxysilane, dicyclopentadienylpropyldiisopropoxysilane, bisbicycloheptenyldimethoxysilane, bisbicycloheptenyldiethoxysilane, bisbicycloheptenyldipropoxysilane, bisbicycloheptenyldiisopropoxysilane, bisbicycloheptyldimethoxysilane, bisbicycloheptyldiethoxysilane, bisbicycloheptyldipropoxysilane, bisbicycloheptyldiisopropoxysilane, diadamantyldimethoxysilane, diadamantyldiethoxysilane, diadamantyldipropoxysilane, diadamantyldiisopropoxysilane, diphenyldimethoxysilane, diphenyldiethoxysilane, methylphenyldimethoxysilane, methylphenyldiethoxysilane, diphenyldipropoxysilane, and diphenyldiisopropoxysilane.

Examples of monoalkoxysilanes which satisfy m11+m12+m13=3 include trimethylmethoxysilane, trimethylethoxysilane, dimethylethylmethoxysilane, dimethylethylethoxysilane, dimethylphenylmethoxysilane, dimethylphenylethoxysilane, dimethylbenzylmethoxysilane, dimethylbenzylethoxysilane, dimethylphenethylmethoxysilane, and dimethylphenethylethoxysilane.

Preferable examples among them include tetramethoxysilane, tetraethoxysilane methyltrimethoxysilane, methyltriethoxysilane, ethyltrimethoxysilane, ethyltriethoxysilane, vinyltrimethoxysilane, vinyltriethoxysilane, n-propyltrimethoxysilane, n-propyltriethoxysilane, isopropyltrimethoxysilane, isopropyltriethoxysilane, n-butyltrimethoxysilane, n-butyltriethoxysilane, isobutyltrimethoxysilane, isobutyltriethoxysilane, allyltrimethoxysilane, allyltriethoxysilane, cyclopentyltrimethoxysilane, cyclopentyltriethoxysilane, cyclohexyltrimethoxysilane, cyclohexyltriethoxysilane, cyclohexenyltrimethoxysilane, cyclohexenyltriethoxysilane, phenyltrimethoxysilane, phenyltriethoxysilane, benzyltrimethoxysilane, benzyltriethoxysilane, phenethyltrimethoxysilane, and phenethyltriethoxysilane, dimethyldimethoxysilane, dimethyldiethoxysilane, diethyldimethoxysilane, diethyldiethoxysilane, methylethyldimethoxysilane, methylethyldiethoxysilane, di-n-propyldimethoxysilane, dibutyldimethoxysilane, methylphenyldimethoxysilane, methylphenyldiethoxysilane, trimethylmethoxysilane, dimethylethylmethoxysilane, dimethylphenylmethoxysilane, dimethylbenzylmethoxysilane, and dimethylphenethylmethoxysilane.

The compounds represented by the general formula (A-2-2) may be shown below, but the compounds are not restricted to these compounds.

When U is boron, examples of the compounds represented by the formula (A-2-2) include, as monomers, boron methoxide, boron ethoxide, boron propoxide, boron butoxide, boron amyloxide, boron hexyloxide, boron cyclopentoxide, boron cyclohexyloxide, boron allyloxide, boron phenoxide, boron methoxyethoxide, and boric acid, boron oxide.

When U is aluminum, examples of the compounds represented by the formula (A-2-2) include, as monomers, aluminum methoxide, aluminum ethoxide, aluminum propoxide, aluminum butoxide, aluminum amyloxide, aluminum hexyloxide, aluminum cyclopentoxide, aluminum cyclohexyloxide, aluminum allyloxide, aluminum phenoxide, aluminum methoxyethoxide, aluminum ethoxyethoxide, aluminum dipropoxyethyl-acetoacetate, aluminum dibutoxyethyl-acetoacetate, aluminum propoxy-bis-ethyl-acetoacetate, aluminum butoxy-bis-ethyl-acetoacetate, aluminum 2,4-pentanedionate, and aluminum 2,2,6,6-tetramethyl-3,5-heptanedionate.

When U is gallium, examples of the compounds represented by the formula (A-2-2) include, as monomers, gallium methoxide, gallium ethoxide, gallium propoxide, gallium butoxide, gallium amyloxide, gallium hexyloxide, gallium cyclopentoxide, gallium cyclohexyloxide, gallium allyloxide, gallium phenoxide, gallium methoxyethoxide, gallium ethoxyethoxide, gallium dipropoxyethyl-acetoacetate, gallium dibutoxyethyl-acetoacetate, gallium propoxy-bis-ethyl-acetoacetate, gallium butoxy-bis-ethyl-acetoacetate, gallium 2,4-pentanedionate, and gallium 2,2,6,6-tetramethyl-3,5-heptanedionate.

When U is yttrium, examples of the compounds represented by the formula (A-2-2) include, as monomers, yttrium methoxide, yttrium ethoxide, yttrium propoxide, yttrium butoxide, yttrium amyloxide, yttrium hexyloxide, yttrium cyclopentoxide, yttrium cyclohexyloxide, yttrium allyloxide, yttrium phenoxide, yttrium methoxyethoxide, yttrium ethoxyethoxide, yttrium dipropoxyethyl-acetoacetate, yttrium dibutoxyethyl-acetoacetate, yttrium propoxy-bis-ethyl-acetoacetate, yttrium butoxy-bis-ethyl-acetoacetate, yttrium 2,4-pentanedionate, and yttrium 2,2,6,6-tetramethyl-3,5-heptanedionate.

When U is germanium, examples of the compounds represented by the formula (A-2-2) include, as monomers, germanium methoxide, germanium ethoxide, germanium propoxide, germanium butoxide, germanium amyloxide, germanium hexyloxide, germanium cyclopentoxide, germanium cyclohexyloxide, germanium allyloxide, germanium phenoxide, germanium methoxyethoxide, and germanium ethoxyethoxide.

When U is titanium, examples of the compounds represented by the formula (A-2-2) include, as monomers, titanium methoxide, titanium ethoxide, titanium propoxide, titanium butoxide, titanium amyloxide, titanium hexyloxide, titanium cyclopentoxide, titanium cyclohexyloxide, titanium allyloxide, titanium phenoxide, titanium methoxyethoxide, titanium ethoxyethoxide, titanium dipropoxy-bisethyl-acetoacetate, titanium dibutoxy-bisethyl-acetoacetate, titanium dipropoxy-bis-2,4-pentanedionate, and titanium dibutoxy-bis-2,4-pentanedionate.

When U is zirconium, examples of the compounds represented by the formula (A-2-2) include, as monomers, methoxy zirconium, ethoxy zirconium, propoxy zirconium, butoxy zirconium, phenoxy zirconium, zirconium dibutoxide-bis(2,4-pentanedionate), and zirconium dipropoxide-bis (2,2,6,6-tetramethyl-3,5-heptanedionate).

When U is hafnium, examples of the compounds represented by the formula (A-2-2) include, as monomers, hafnium methoxide, hafnium ethoxide, hafnium propoxide, hafnium butoxide, hafnium amyloxide, hafnium hexyloxide, hafnium cyclopentoxide, hafnium cyclohexyloxide, hafnium allyloxide, hafnium phenoxide, hafnium methoxyethoxide, hafnium ethoxyethoxide, hafnium dipropoxy-bisethyl-acetoacetate, hafnium dibutoxy-bisethyl-acetoacetate, hafnium dipropoxy-bis-2,4-pentanedionate, and hafnium dibutoxy-bis-2,4-pentanedionate.

When U is bismuth, examples of the compounds represented by the formula (A-2-2) include, as monomers, methoxy bismuth, ethoxy bismuth, propoxy bismuth, butoxy bismuth, and phenoxy bismuth.

When U is tin, examples of the compounds represented by the formula (A-2-2) include, as monomers, methoxy tin, ethoxy tin, propoxy tin, butoxy tin, phenoxy tin, methoxyethoxy tin, ethoxyethoxy tin, tin 2,4-pentanedionate, and tin 2,2,6,6-tetramethyl-3,5-heptanedionate.

When U is phosphorus, examples of the compounds represented by the formula (A-2-2) include, as monomers, trimethyl phosphite, triethyl phosphite, tripropyl phosphite, trimethyl phosphate, triethyl phosphate, tripropyl phosphate, and diphosphorus pentoxide.

When U is vanadium, examples of the compounds represented by the formula (A-2-2) include, as monomers, vanadium oxide-bis(2,4-pentanedionate), vanadium 2,4-pentanedionate, vanadium tributoxide oxide, and vanadium tripropoxide oxide.

When U is arsenic, examples of the compounds represented by the formula (A-2-2) include, as monomers, methoxy arsenic, ethoxy arsenic, propoxy arsenic, butoxy arsenic, and phenoxy arsenic.

When U is antimony, examples of the compounds represented by the formula (A-2-2) include, as monomers, methoxy antimony, ethoxy antimony, propoxy antimony, butoxy antimony, phenoxy antimony, antimony acetate, and antimony propionate.

When U is niobium, examples of the compounds represented by the formula (A-2-2) include, as monomers, methoxy niobium, ethoxy niobium, propoxy niobium, butoxy niobium, and phenoxy niobium.

When U is tantalum, examples of the compounds represented by the formula (A-2-2) include, as monomers, methoxy tantalum, ethoxy tantalum, propoxy tantalum, butoxy tantalum, and phenoxy tantalum.

It is possible to mix one or more kinds selected from a hydrolyzable silicon compound represented by the above general formula (A-1), a hydrolyzate of the compound, a condensate of the compound, and a hydrolysis condensate of the compound; and one or more kinds of compounds each selected from a group consisting of a hydrolyzable silicon compound represented by the above general formula (A-2-1), a hydrolyzate of the compound, a condensate of the compound, a hydrolysis condensate of the compound, a reactive compound represented by the above general formula (A-2-2), a hydrolyzate of the compound, a condensate of the compound, and a hydrolysis condensate of the compound, before or during the reaction, to prepare a reaction starting material for forming a silicon-containing compound (A).

As the preferable manufacturing methods, following methods may be mentioned, though not limited to them.

The silicon-containing compound (A) can be produced, by conducting hydrolytic condensation between the above reaction starting material (hereinafter referred to as "monomer"), while adopting, as an acid catalyst, one or more kinds of compounds preferably selected from inorganic acids, aliphatic sulfonic acids, and aromatic sulfonic acids.

Examples of the acid catalyst to be used at this time include hydrofluoric acid, hydrochloric acid, hydrobromic acid, sulfuric acid, nitric acid, perchloric acid, phosphoric acid, methanesulfonic acid, benzenesulfonic acid, and toluenesulfonic acid. The catalyst is used in an amount of $10^{-6}$ to 10 moles, preferably $10^{-5}$ to 5 moles, more preferably $10^{-4}$ to 1 mole, relative to 1 mole of monomers.

The amount of water upon obtainment of the silicon-containing compound (A) from these monomers by hydrolytic condensation, is 0.01 to 100 moles, preferably 0.05 to 50 moles, and more preferably 0.1 to 30 moles, per mole of hydrolyzable substitutional groups bonded to the monomers. Addition amounts 100 moles or less are economical, due to small-sized apparatuses to be used for reactions.

As a manipulation manner, for example, the monomers are added into an aqueous catalyst solution, to cause initiation of a hydrolytic condensation reaction. At this time, the organic solvent may be added into the aqueous catalyst solution, or monomers may have been diluted with the organic solvent, or both procedures may be performed. The reaction temperature is to be 0 to 100° C., preferably 5 to 80° C. it is a preferable manner to keep the temperature at 5 to 80° C. upon dropping of the monomers, and subsequently mature them at 20 to 80° C.

Examples of organic solvents, which can be added into the aqueous catalyst solution or which can dilute the monomers, include methanol, ethanol, 1-propanol, 2-propanol, 1-butanol, 2-butanol, 2-methyl-1-propanol, acetone, acetonitrile, tetrahydrofuran, toluene, hexane, ethyl acetate, cyclohexanone, methylamylketone, butane diol monomethyl ether, propylene glycol monomethyl ether, ethylene glycol monomethyl ether, butane diol monoethyl ether, propylene glycol monoethyl ether, ethylene glycol monoethyl ether, propylene glycol dimethyl ether, diethylene glycol dimethyl ether, propylene glycol monomethyl ether acetate, propylene glycol monoethyl ether acetate, ethyl pyruvate, butyl acetate, methyl 3-methoxypropionate, ethyl 3-ethoxypropionate, tert-butyl acetate, tert-butyl propionate, propylene glycol mono-tert-butyl ether acetate, γ-butyrolactone, and mixtures of them.

Water-soluble ones are preferable among them. Examples thereof include: alcohols such as methanol, ethanol, 1-propanol, and 2-propanol; polyvalent alcohols such as ethylene glycol and propylene glycol; polyvalent alcohol condensation derivatives such as butane dial monomethyl ether, propylene glycol monomethyl ether, ethylene glycol monomethyl ether, butane diol monoethyl ether, propylene glycol monoethyl ether, ethylene glycol monoethyl ether, butane diol monopropyl ether, propylene glycol monopropyl ether, and ethylene glycol monopropyl ether; acetone; acetonitrile; and tetrahydrofuran. Those having boiling points of 100° C. or lower are especially preferable among them.

Note that the usage amount of the organic solvent is preferably to be 0 to 1,000 ml, particularly preferably 0 to 500 ml, relative to 1 mole of monomers. Usage amounts of the organic solvent in this range need not use large reaction vessels, and thus, the reaction can be conducted economically.

Thereafter, neutralization reaction of the catalyst is conducted if necessary, and the alcohol produced by the hydrolytic condensation reaction is removed under reduced pressure, thereby obtaining an aqueous solution of reaction product mixture. At this time, the amount of an alkaline substance usable for neutralization is preferably 0.1 to 2 equivalents relative to the acid used as the catalyst. This alkaline substance is arbitrary, insofar as the same exhibits alkalinity in water.

Subsequently, it is preferable to remove by-products such as alcohols produced by the hydrolytic condensation reaction, from the reaction product mixture. Although the temperature for heating the reaction product mixture at this time depends on the kinds of the added organic solvent and alcohols and the like produced by the reaction, the temperature is preferably 0 to 100° C., more preferably 10 to 90° C., and even more preferably 15 to 80° C. Further, although the reduced pressure varies depending on the types of organic solvent and alcohol to be removed, types of evacuating apparatus and condensation apparatus, and the heating temperature, the reduced pressure is preferably at the atmospheric pressure or lower, more preferably 80 kPa or lower in absolute pressure, and even more preferably 50 kPa or lower in absolute pressure. Although it is difficult at this time to accurately determine amounts of alcohols to be removed, it is desirable to remove about 80 mass % or more of produced alcohols and the like.

Next, it is possible to remove the acid catalyst used for the hydrolytic condensation, from the reaction product mixture. As a procedure for removing the acid catalyst, the silicon-containing compound is mixed with water, and the silicon-containing compound is extracted with an organic solvent.

Suitable as an organic solvent to be used then, is one which allows for dissolution of the silicon-containing compound therein and which is separated in a two-layered manner from water upon mixing therewith. Examples thereof include methanol, ethanol, 1-propanol, 2-propanol, 1-butanol, 2-butanol, 2-methyl-1-propanol, acetone, tetrahydrofuran, toluene, hexane, ethyl acetate, cyclohexanone, methylamylketone, butane diol monomethyl ether, propylene glycol monomethyl ether, ethylene glycol monomethyl ether, butane diol monoethyl ether, propylene glycol monoethyl ether, ethylene glycol monoethyl ether, butane diol monopropyl ether, propylene glycol monopropyl ether, ethylene glycol monopropyl ether, propylene glycol dimethyl ether, diethylene glycol dimethyl ether, propylene glycol monomethyl ether acetate, propylene glycol monoethyl ether acetate, ethyl pyruvate, butyl acetate, methyl 3-methoxypropionate, ethyl 3-ethoxypropionate, tert-butyl acetate, tert-butyl propionate, propylene glycol mono-tert-butyl ether acetate, γ-butyrolactone, methyl isobutyl ketone, cyclopentyl methyl ether, and mixtures thereof.

It is also possible to use a mixture of a water-soluble organic solvent and a water hardly-soluble organic solvent. Examples of preferable mixtures include, without limited thereto, combinations of methanol+ethyl acetate, ethanol+ethyl acetate, 1-propanol+ethyl acetate, 2-propanol+ethyl acetate, butane dial monomethyl ether+ethyl acetate, propylene glycol monomethyl ether+ethyl acetate, ethylene glycol monomethyl ether+ethyl acetate, butane dial monoethyl ether+ethyl acetate, propylene glycol monoethyl ether+ethyl acetate, ethylene glycol monoethyl ether-1-ethyl acetate, butane dial monopropyl ether+ethyl acetate, propylene glycol monopropyl ether+ethyl acetate, ethylene glycol monopropyl ether+ethyl acetate, methanol+methyl isobutyl ketone, ethanol+methyl isobutyl ketone, 1-propanol+methyl isobutyl ketone, 2-propanol+methyl isobutyl ketone, propylene glycol monomethyl ether+methyl isobutyl ketone, ethylene glycol monomethyl ether+methyl isobutyl ketone, propylene glycol monoethyl ether+methyl isobutyl ketone, ethylene glycol monoethyl ether+methyl isobutyl ketone, propylene glycol monopropyl ether+methyl isobutyl ketone, ethylene glycol monopropyl ether+methyl isobutyl ketone, methanol+cyclopentyl methyl ether, ethanol+cyclopentyl methyl ether, 1-propanol+cyclopentyl methyl ether, 2-propanol+cyclopentyl methyl ether, propylene glycol monomethyl ether+cyclopentyl methyl ether, ethylene glycol monomethyl ether+cyclopentyl methyl ether, propylene glycol monoethyl ether+cyclopentyl methyl ether, ethylene glycol monoethyl ether+cyclopentyl methyl ether, propylene glycol monopropyl ether+cyclopentyl methyl ether, ethylene glycol monopropyl ether+cyclopentyl methyl ether, methanol+propylene glycol methyl ether acetate, ethanol+propylene glycol methyl ether acetate, 1-propanol+propylene glycol methyl ether acetate, 2-propanol+propylene glycol methyl ether acetate, propylene glycol monomethyl ether+propylene glycol methyl ether acetate, ethylene glycol monomethyl ether+propylene glycol methyl ether acetate, propylene glycol monoethyl ether+propylene glycol methyl ether acetate, ethylene glycol monoethyl ether+propylene glycol methyl ether acetate, propylene glycol monopropyl ether+propylene glycol methyl ether acetate, and ethylene glycol monopropyl ether+propylene glycol methyl ether acetate.

Note that although the mixing ratio of the water-soluble organic solvent and the water hardly-soluble organic solvent is to be appropriately selected, the water-soluble organic solvent is selected to be 0.1 to 1,000 parts by mass, preferably 1 to 500 parts by mass, more preferably 2 to 100 parts by mass, relative to 100 parts by mass of the water-hardly soluble organic solvent.

The procedure is followed by washing by neutral water. Usable as such neutral water is so-called deionized water or ultrapure water. The amount of such water is to be 0.01 to 100 L, preferably 0.05 to 50 L, and more preferably 0.1 to 5 L, relative to 1 L of the silicon-containing compound solution. The washing procedure may be conducted by introducing both liquids into one vessel, stirring them, and then leaving them to stand still, followed by separation of a water layer. It is enough for the number of washing steps to be one or more, preferably one to about five, because commensurate effects are not obtained even by washing of ten or more times.

Other examples of methods for removing the acid catalyst include a method based on an ion-exchange resin, and a method for conducting neutralization by epoxy compounds such as ethylene oxide and propylene oxide followed by removal. These methods can be appropriately selected in conformity to the acid catalyst for the reaction.

The phrase that the acid catalyst has been substantially removed in the above catalyst removal operation, means that the acid catalyst used for the reaction is allowed to be left in an amount of about 10 mass or less, preferably 5 mass % or less, relative to the amount added at the initiation of reaction in the silicon-containing compound.

Since a part of the silicon-containing compound is sometimes migrated into a water layer by the washing operation at this time to provide an effect substantially equivalent to a fractionation, the number of washing times and the amount of washing water may be appropriately selected in view of the catalyst removal effect and fractionation effect.

In both cases of a silicon-containing compound including the acid catalyst left therein and a silicon-containing compound solution from which the acid catalyst has been removed, a final solvent is added thereto, and solvent exchange is conducted under reduced pressure, to obtain a resultant silicon-containing compound solution. Although the temperature for solvent exchange depends on the types of reaction solvent, extraction solvent and the like to be removed, the temperature is preferably 0 to 100° C., more preferably 10 to 90° C., and even more preferably 15 to 80° C. Further, although the reduced pressure varies depending on the type of extraction solvent to be removed, types of evacuating apparatus and condensation apparatus, and the heating temperature, the reduced pressure is preferably at the atmospheric pressure or lower, more preferably 80 kPa or lower in absolute pressure, and even more preferably 50 kPa or lower in absolute pressure.

At this time, the silicon-containing compound is sometimes made unstable, due to exchange of solvents. This phenomenon is caused depending on the compatibility between the final solvent and the silicon-containing compound, and it is possible to add the component (D) to be described later as a stabilizer, so as to prevent the phenomenon. The amount to be added is 0 to 25 parts by mass, preferably 0 to 15 parts by mass, and more preferably 0 to 5 parts by mass relative to 100 parts by mass of the silicon-containing compound in the solution before solvent exchange, and 0.5 or more parts by mass are preferable in case of addition. If necessary, it is possible to add the component (D) to the solution before solvent exchange and to subsequently conduct a solvent exchange operation.

When the silicon-containing compound (A) is concentrated to a certain concentration or denser, condensation reaction is progressed, so that the compound is changed into a state incapable of being re-dissolved in an organic solvent. As such, the compound is to be preferably kept in a solution state at an appropriate concentration. In turn, excessively diluted compounds uneconomically lead to excessive amounts of solvents. Thus, the suitable concentration in this case is preferably 0.1 to 20 mass %.

Suitable as a final solvent to be added to the silicon-containing compound solution is an alcohol-based solvent, and particularly desirable examples thereof include monoalkyl ether derivatives of: ethylene glycol, diethylene glycol, triethylene glycol, propylene glycol, dipropylene glycol, and butanediol. Preferable examples concretely include butane diol monomethyl ether, propylene glycol monomethyl ether, ethylene glycol monomethyl ether, butane diol monoethyl ether, propylene glycol monoethyl ether, ethylene glycol monoethyl ether, butane diol monopropyl ether, propylene glycol monopropyl ether, and ethylene glycol monopropyl ether.

Alternatively, in the case that the alcohol-based solvents are main components, a non-alcoholic solvent may be added as a supplemental solvent. Examples of this supplemental solvents include acetone, tetrahydrofurane, toluene, hexane, ethyl acetate, cyclohexanone, methylamyl ketone, propylene glycol dimethyl ether, diethylene glycol dimethyl ether, propylene glycol monomethyl ether acetate, propylene glycol monoethyl ether acetate, ethyl pyruvate, butyl acetate, methyl 3-methoxypropionate, ethyl 3-ethoxypropionate, tert-butyl acetate, tert-butyl propionate, propylene glycol mono-tert-butyl ether acetate, γ-butyrolactone, methyl isobutyl ketone, and cyclopentyl methyl ether.

As another operation for reaction, water or water-containing organic solvent is added to the monomers or an organic solution of monomers, to initiate a hydrolysis reaction. At this time, the catalyst may be added to the monomers or the organic solution of monomers, or may have been added into water or the water-containing organic solvent. The reaction temperature is to be 0 to 100° C., preferably 10 to 80° C. It is a preferable procedure to conduct heating to 10 to 50° C. upon dropping of water, and to subsequently raise the temperature to 20 to 80° C. for maturation.

In case of using organic solvents, water-soluble ones are preferable, and examples thereof include methanol, ethanol, 1-propanol, 2-propanol, 1-butanol, 2-butanol, 2-methyl-1-propanol, acetone, tetrahydrofuran, acetonitrile; and polyvalent alcohol condensate derivatives such as: butane diol monomethyl ether, propylene glycol monomethyl ether, ethylene glycol monomethyl ether, butane diol monoethyl ether, propylene glycol monoethyl ether, ethylene glycol monoethyl ether, butane diol monopropyl ether, propylene glycol monopropyl ether, ethylene glycol monopropyl ether, propylene glycol dimethyl ether, diethylene glycol dimethyl ether, propylene glycol monomethyl ether acetate, propylene glycol monoethyl ether acetate, and propylene glycol monopropyl ether; and mixtures thereof.

The usage amount of the organic solvent may be the same as the above. The obtained reaction product mixture is post-treated in the same manner as the above, to obtain the silicon-containing compound (A).

Although the molecular weight of the obtained silicon-containing compound (A) can be adjusted not only by selection of monomers but also by control of reaction condition upon polymerization, adoption of compounds having weight-average molecular weights exceeding 100,000 occasionally cause occurrence of extraneous substances or coating patch, so that those compounds are to be preferably used which have weight-average molecular weights of 100,000 or less, preferably 200 to 50,000, and more preferably 300 to 30,000, respectively. Note that the data concerning the weight-average molecular weight is obtained as a molecular weight determined by gel permeation chromatography (GPC) using an $R^1$ detector, polystyrene as standard substance and tetrahydrofuran as elution solvent.

The silicon-containing film-forming composition of the present invention is allowed to contain two or more kinds of silicon-containing compounds which are mutually different in composition and/or reaction condition, respectively.

In the present invention, the silicon-containing film-forming composition is prepared by further blending the organic solvent (B) into the silicon-containing compound (A).

As the component (B), the same organic solvent as used upon production of the silicon-containing compound (A) as described above can be used, and preferable examples to be used include water-soluble organic solvents, particularly monoalkyl ether of ethylene glycol, diethylene glycol, triethylene glycol, propylene glycol, dipropylene glycol, butanediol, and pentanediol. Concretely used are organic solvents selected from among butane diol monomethyl ether, propylene glycol monomethyl ether, ethylene glycol monomethyl ether, butane diol monoethyl ether, propylene glycol monoethyl ether, ethylene glycol monoethyl ether, butane diol monopropyl ether, propylene glycol monopropyl ether, and ethylene glycol monopropyl ether.

The thermal crosslinking accelerator as the component (C) can be contained in the composition of the present invention so as to further promote a cross-linking reaction upon formation of the silicon-containing film. Examples of such a thermal crosslinking accelerator include compounds represented by the general formula (3) or (4):

  (3), wherein

L represents a cation of an element belonging to the 1a group of the periodic table, X represents one of a hydroxide ion, and a monovalent or di- or more valent organic acid ion having 1 to 30 carbon atoms, which acid ion may be substituted with a halogen atom, phosphoric acid ion, nitric acid ion, or carbonic acid ion, a represents an integer of 1 or more, b represents an integer of 0, 1, or more, and a+b represents a valence to be determined by the X, and

  (4), wherein

M represents a sulfonium, iodonium, or ammonium,

A represents one of a hydroxide ion, and a monovalent or di- or more valent organic acid ion having 1 to 30 carbon atoms, which acid ion may be substituted with a halogen atom, phosphoric acid ion, nitric acid ion, or carbonic acid ion, or a halogen ion, or a halogen acid ion, a' represents an integer of 1 or more, b' represents an integer of 0, 1, or more, and a'+b' represents a valence to be determined by the A.

Examples of the compound represented by the general formula (3) include alkali metal salts of organic acids. Examples include salts of lithium, sodium, potassium, rubidium and cesium with monovalent acids such as hydroxide, nitric acid, hydrochloric acid, formic acid, acetic acid, propionic acid, butanoic acid, pentanoic acid, hexanoic acid, heptanoic acid, octanoic acid, nonanoic acid, decanoic acid, oleic acid, stearic acid, linoleic acid, linolenic acid, benzoic acid, phthalic acid, isophthalic acid, terephthalic acid, salicylic acid, trifluoroacetic acid, monochloroacetic acid, dichloroacetic acid, and trichloroacetic acid; and salts of lithium, sodium, potassium, rubidium and cesium with monovalent or divalent acids such as oxalic acid, malonic acid, methylmalonic acid, ethylmalonic acid, propylmalonic acid, butylmalonic acid, dimethylmalonic acid, diethylmalonic acid, succinic acid, methylsuccinic acid, glutaric acid, adipic acid, itaconic acid, maleic acid, fumaric acid, citraconic acid, citric acid, and carbonic acid.

Concrete examples include lithium formate, lithium acetate, lithium propionate, lithium butanoate, lithium pentanoate, lithium hexanoate, lithium heptanoate, lithium octanoate, lithium nonanoate, lithium decanoate, lithium oleate, lithium stearate, lithium linoleate, lithium linolenate, lithium benzoate, lithium phthalate, lithium isophthalate, lithium terephthalate, lithium salicylate, lithium trifluoroacetate, lithium monochloroacetate, lithium dichloroacetate, lithium trichloroacetate, lithium hydroxide, lithium nitrate, lithium chloride, lithium hydrogen oxalate, lithium hydrogen malonate, lithium hydrogen methylmalonate, lithium hydrogen ethylmalonate, lithium hydrogen propylmalonate, lithium hydrogen butylmalonate, lithium hydrogen dimethylmalonate, lithium hydrogen diethylmalonate, lithium hydrogen succinate, lithium hydrogen methylsuccinate, lithium hydrogen glutarate, lithium hydrogen adipate, lithium hydrogen itaconate, lithium hydrogen maleate, lithium hydrogen fumarate, lithium hydrogen citraconate, lithium hydrogen citrate, lithium hydrogen carbonate, lithium oxalate, lithium malonate, lithium methylmalonate, lithium ethylmalonate, lithium propylmalonate, lithium butylmalonate, lithium dimethylmalonate, lithium diethylmalonate, lithium succinate, lithium methylsuccinate, lithium glutarate, lithium adipate, lithium itaconate, lithium maleate, lithium fumarate, lithium citraconate, lithium citrate, and lithium carbonate;

sodium formate, sodium acetate, sodium propionate, sodium butanoate, sodium pentanoate, sodium hexanoate, sodium heptanoate, sodium octanoate, sodium nonanoate, sodium decanoate, sodium oleate, sodium stearate, sodium linoleate, sodium linolenate, sodium benzoate, sodium phthalate, sodium isophthalate, sodium terephthalate, sodium salicylate, sodium trifluoroacetate, sodium monochloroacetate, sodium dichloroacetate, sodium trichloroacetate, sodium hydroxide, sodium nitrate, sodium chloride, sodium hydrogen oxalate, sodium hydrogen malonate, sodium hydrogen methylmalonate, sodium hydrogen ethylmalonate, sodium hydrogen propylmalonate, sodium hydrogen butylmalonate, sodium hydrogen dimethylmalonate, sodium hydrogen diethylmalonate, sodium hydrogen succinate, sodium hydrogen methylsuccinate, sodium hydrogen glutarate, sodium hydrogen adipate, sodium hydrogen itaconate, sodium hydrogen maleate, sodium hydrogen fumarate, sodium hydrogen citraconate, sodium hydrogen citrate, sodium hydrogen carbonate, sodium oxalate, sodium malonate, sodium methylmalonate, sodium ethylmalonate, sodium propylmalonate, sodium butylmalonate, sodium dimethylmalonate, sodium diethylmalonate, sodium succinate, sodium methylsuccinate, sodium glutarate, sodium adipate, sodium itaconate, sodium maleate, sodium fumarate, sodium citraconate, sodium citrate, and sodium carbonate; and potassium formate, potassium acetate, potassium propionate, potassium butanoate, potassium pentanoate, potassium hexanoate, potassium heptanoate, potassium octanoate, potassium nonanoate, potassium decanoate, potassium oleate, potassium stearate, potassium linoleate, potassium linolenate, potassium benzoate, potassium phthalate, potassium isophthalate, potassium terephthalate, potassium salicylate, potassium trifluoroacetate, potassium monochloroacetate, potassium dichloroacetate, potassium trichloroacetate, potassium hydroxide, potassium nitrate, potassium chloride, potassium hydrogen oxalate, potassium hydrogen malonate, potassium hydrogen methylmalonate, potassium hydrogen ethylmalonate, potassium hydrogen propylmalonate, potassium hydrogen butylmalonate, potassium hydrogen dimethylmalonate, potassium hydrogen diethylmalonate, potassium hydrogen succinate, potassium hydrogen methylsuccinate, potassium hydrogen glutarate, potassium hydrogen adipate, potassium hydrogen itaconate, potassium hydrogen maleate, potassium hydrogen fumarate, potassium hydrogen citraconate, potassium hydrogen citrate, potassium hydrogen carbonate, potassium oxalate, potassium malonate, potassium methylmalonate, potassium ethylmalonate, potassium propylmalonate, potassium butylmalonate, potassium dimethylmalonate, potassium diethylmalonate, potassium succinate, potassium methylsuccinate, potassium glutarate, potassium adipate, potassium itaconate, potassium maleate, potassium fumarate, potassium citraconate, potassium citrate, and potassium carbonate.

Examples of the compound represented by the general formula (4) include sulfonium compounds, iodonium compounds, and ammonium compounds represented by formulae (Q-1), (Q-2), and (Q-3), respectively:

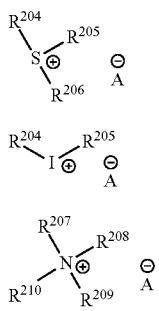

(Q-1)

(Q-2)

(Q-3)

wherein $R^{204}$, $R^{205}$, and $R^{206}$ each represent a linear, branched, or cyclic alkyl, alkenyl, oxoalkyl, or oxoalkenyl group having 1 to 12 carbon atoms, a substituted or unsubstituted aryl group having 6 to 20 carbon atoms, or an aralkyl or aryloxoalkyl group having 7 to 12 carbon atoms, wherein some or all hydrogen atoms of these groups may be substituted by alkoxy groups or the like, and wherein $R^{205}$ and $R^{206}$ may form a ring together with a sulfur atom to which they bond, and when a ring is formed, $R^{205}$ and $R^{206}$ each represent an alkylene group having 1 to 6 carbon atoms;

$A^-$ represents a non-nucleophilic counter ion; and $R^{207}$, $R^{208}$, $R^{209}$, and $R^{210}$ are the same as $R^{204}$, $R^{205}$, and $R^{206}$, and may be a hydrogen atom;

wherein $R^{207}$ and $R^{208}$, or $R^{207}$, $R^{208}$ and $R^{209}$ may form a ring together with a nitrogen atom to which they bond, and when a ring is formed, $R^{207}$ and $R^{208}$, or $R^{207}$, $R^{208}$ and $R^{209}$ represent an alkylene group having 3 to 10 carbon atoms.

As $R^{204}$, $R^{205}$, $R^{206}$, $R^{207}$, $R^{208}$, $R^{209}$, and $R^{210}$, concrete examples of alkyl groups include methyl, ethyl, propyl, isopropyl, n-butyl, sec-butyl, tert-butyl, pentyl, hexyl, heptyl, octyl, cyclopentyl, cyclohexyl, cycloheptyl, cyclopropylmethyl, 4-methylcyclohexyl, cyclohexylmethyl, norbornyl, and adamantyl groups. Examples of alkenyl groups include vinyl, allyl, propenyl, butenyl, hexenyl, and cyclohexenyl groups. Examples of oxoalkyl groups include 2-oxocyclopentyl and 2-oxocyclohexyl as well as 2-oxopropyl, 2-cyclopentyl-2-oxoethyl, 2-cyclohexyl-2-oxoethyl, and 2-(4-methylcyclohexyl)-2-oxoethyl groups. Examples of aryl groups include phenyl and naphthyl groups; alkoxyphenyl groups such as p-methoxyphenyl, m-methoxyphenyl, o-methoxyphenyl, ethoxyphenyl, p-tert-butoxyphenyl, and m-tert-butoxyphenyl groups; alkylphenyl groups such as 2-methylphenyl, 3-methylphenyl, 4-methylphenyl, ethylphenyl, 4-tert-butylphenyl, 4-butylphenyl, and dimethylphenyl groups; alkylnaphthyl groups such as methylnaphthyl and ethylnaphthyl groups; alkoxynaphthyl groups such as methoxynaphthyl and ethoxynaphthyl groups; dialkylnaphthyl groups such as dimethylnaphthyl and diethylnaphthyl groups; and dialkoxynaphthyl groups such as dimethoxynaphthyl and diethoxynaphthyl groups. Examples of aralkyl groups include benzyl, phenylethyl, and phenethyl groups. Examples of aryloxoalkyl groups include 2-aryl-2-oxoethyl groups such as 2-phenyl-2-oxoethyl, 2-(1-naphthyl)-2-oxoethyl, and 2-(2-naphthyl)-2-oxoethyl groups.

Examples of $A^-$ include hydroxyl ion, formate ion, acetate ion, propionate ion, butanoate ion, pentanoate ion, hexanoate ion, heptanoate ion, octanoate ion, nonanoate ion, decanoate ion, oleate ion, stearate ion, linoleate ion, linolenate ion, benzoate ion, p-methylbenzoate ion, p-t-butylbenzoate ion, phthalate ion, isophthalate ion, terephthalate ion, salicylate ion, trifluoroacetate ion, monochloroacetate ion, dichloroacetate ion, trichloroacetate ion, fluoride ion, chloride ion, bromide ion, iodide ion, nitrate ion, chlorate ion, perchlorate ion, bromate ion, iodate ion, oxalate ion, malonate ion, methylmalonate ion, ethylmalonate ion, propylmalonate ion, butylmalonate ion, dimethylmalonate ion, diethylmalonate ion, succinate ion, methylsuccinate ion, glutarate ion, adipate ion, itaconate ion, maleate ion, fumarate ion, citraconate ion, citrate ion, and carbonate ion.

Concrete examples of sulfonium compounds include triphenylsulfonium formate, triphenylsulfonium acetate, triphenylsulfonium propionate, triphenylsulfonium butanoate, triphenylsulfonium pentanoate, triphenylsulfonium hexanoate, triphenylsulfonium heptanoate, triphenylsulfonium octanoate, triphenylsulfonium nonanoate, triphenylsulfonium decanoate, triphenylsulfonium oleate, triphenylsulfonium stearate, triphenylsulfonium linoleate, triphenylsulfonium linolenate, triphenylsulfonium benzoate, triphenylsulfonium p-methylbenzoate, triphenylsulfonium p-t-butylbenzoate, triphenylsulfonium phthalate, triphenylsulfonium isophthalate, triphenylsulfonium terephthalate, triphenylsulfonium salicylate, triphenylsulfonium trifluoroacetate, triphenylsulfonium monochloroacetate, triphenylsulfonium dichloroacetate, triphenylsulfonium trichloroacetate, triphenylsulfonium hydroxide, triphenylsulfonium oxalate, triphenylsulfonium malonate, triphenylsulfonium methylmalonate, triphenylsulfonium ethylmalonate, triphenylsulfonium propylmalonate, triphenylsulfonium butylmalonate, triphenylsulfonium dimethylmalonate, triphenylsulfonium diethylmalonate, triphenylsulfonium succinate, triphenylsulfonium methylsuccinate, triphenylsulfonium glutarate, triphenylsulfonium adipate, triphenylsulfonium itaconate, triphenylsulfonium maleate, triphenylsulfonium fumarate, triphenylsulfonium citraconate, triphenylsulfonium citrate, triphenylsulfonium carbonate, triphenylsulfonium chloride, triphenylsulfonium bromide, triphenylsulfonium iodide, triphenylsulfonium nitrate, triphenylsulfonium chlorate, triphenylsulfonium perchlorate, triphenylsulfonium bromate, triphenylsulfonium iodate, bistriphenylsulfonium oxalate, bistriphenylsulfonium malonate, bistriphenylsulfonium methylmalonate, bistriphenylsulfonium ethylmalonate, bistriphenylsulfonium propylmalonate, bistriphenylsulfonium butylmalonate, bistriphenylsulfonium dimethylmalonate, bistriphenylsulfonium diethylmalonate, bistriphenylsulfonium succinate, bistriphenylsulfonium methylsuccinate, bistriphenylsulfonium glutarate, bistriphenylsulfonium adipate, bistriphenylsulfonium itaconate, bistriphenylsulfonium maleate, bistriphenylsulfonium fumarate, bistriphenylsulfonium citraconate, bistriphenylsulfonium citrate, and bistriphenylsulfonium carbonate.

Concrete examples of iodonium compounds include diphenyliodonium formate, diphenyliodonium acetate, diphenyliodonium propionate, diphenyliodonium butanoate, diphenyliodonium pentanoate, diphenyliodonium hexanoate, diphenyliodonium heptanoate, diphenyliodonium octanoate, diphenyliodonium nonanoate, diphenyliodonium decanoate, diphenyliodonium oleate, diphenyliodonium stearate, diphenyliodonium linoleate, diphenyliodonium linolenate, diphenyliodonium benzoate, diphenyliodonium p-methylbenzoate, diphenyliodonium p-t-butylbenzoate, diphenyliodonium phthalate, diphenyliodonium isophthalate, diphenyliodonium terephthalate, diphenyliodonium salicylate, diphenyliodonium trifluoroacetate, diphenyliodonium monochloroacetate, diphenyliodonium dichloroacetate, diphenyliodonium trichloroacetate, diphenyliodonium hydroxide, diphenyliodonium oxalate, diphenyliodonium malonate, diphenyliodonium methylmalonate, diphenyliodonium ethylmalonate, diphenyliodonium propylmalonate, diphenyliodonium butylmalonate, diphenyliodonium dimethylmalonate, diphenyliodonium diethylmalonate, diphenyliodonium succinate, diphenyliodonium methylsuccinate, diphenyliodonium glutarate, diphenyliodonium adipate, diphenyliodonium itaconate, diphenyliodonium maleate, diphenyliodonium fumarate, diphenyliodonium citraconate, diphenyliodonium citrate, diphenyliodonium carbonate, diphenyliodonium chloride, diphenyliodonium bromide, diphenyliodonium iodide, diphenyliodonium nitrate, diphenyliodonium chlorate, diphenyliodonium perchlorate, diphenyliodonium bromate, diphenyliodonium iodate, bisdiphenyliodonium oxalate, bisdiphenyliodonium malonate, bisdiphenyliodonium methylmalonate, bisdiphenyliodonium ethylmalonate, bisdiphenyliodonium propylmalonate, bisdiphenyliodonium butylmalonate, bisdiphenyliodonium dimethylmalonate, bisdiphenyliodonium diethylmalonate, bisdiphenyliodonium succinate, bisdiphenyliodonium methylsuccinate, bisdiphenyliodonium glutarate, bisdiphenyliodonium adipate, bisdiphenyliodonium itaconate, bisdiphenyliodonium maleate, bisdiphenyliodonium fumarate, bisdiphenyliodonium citraconate, bisdiphenyliodonium citrate, and bisdiphenyliodonium carbonate.

Concrete examples of ammonium compounds include tetramethylammonium formate, tetramethylammonium acetate, tetramethylammonium propionate, tetramethylammonium butanoate, tetramethylammonium pentanoate, tetramethylammonium hexanoate, tetramethylammonium heptanoate, tetramethylammonium octanoate, tetramethylammonium nonanoate, tetramethylammonium decanoate, tetramethylammonium oleate, tetramethylammonium stearate, tetramethylammonium linoleate, tetramethylammonium linolenate, tetramethylammonium benzoate, tetramethylammonium p-methylbenzoate, tetramethylammonium p-t-butylbenzoate, tetramethylammonium phthalate, tetramethylammonium isophthalate, tetramethylammonium terephthalate, tetramethylammonium salicylate, tetramethylammonium trifluoroacetate, tetramethylammonium monochloroacetate, tetramethylammonium dichloroacetate, tetramethylammonium trichloroacetate, tetramethylammonium hydroxide, tetramethylammonium oxalate, tetramethylammonium malonate, tetramethylammonium methylmalonate, tetramethylammonium ethylmalonate, tetramethylammonium propylmalonate, tetramethylammonium butylmalonate, tetramethylammonium dimethylmalonate, tetramethylammonium diethylmalonate, tetramethylammonium succinate, tetramethylammonium methylsuccinate, tetramethylammonium glutarate, tetramethylammonium adipate, tetramethylammonium itaconate, tetramethylammonium maleate, tetramethylammonium fumarate, tetramethylammonium citraconate, tetramethylammonium citrate, tetramethylammonium carbonate, tetramethylammonium chloride, tetramethylammonium bromide, tetramethylammonium iodide, tetramethylammonium nitrate, tetramethylammonium chlorate, tetramethylammonium perchlorate, tetramethylammonium bromate, tetramethylammonium iodate, bistetramethylammonium oxalate, bistetramethylammonium malonate, bistetramethylammonium methylmalonate, bistetramethylammonium ethylmalonate, bistetramethylammonium propylmalonate, bistetramethylammonium butylmalonate, bistetramethylammonium dimethylmalonate, bistetramethylammonium diethylmalonate, bistetramethylammonium succinate, bistetramethylammonium methylsuccinate, bistetramethylammonium glutarate, bistetramethylammonium adipate, bistetramethylammonium itaconate, bistetramethylammonium maleate, bistetramethylammonium fumarate, bistetramethylammonium citraconate, bistetramethylammonium citrate, bistetramethylammonium carbonate; tetrapropylammonium formate, tetrapropylammonium acetate, tetrapropylammonium propionate, tetrapropylammonium butanoate, tetrapropylammonium pentanoate, tetrapropylammonium hexanoate, tetrapropylammonium heptanoate, tetrapropylammonium octanoate, tetrapropylammonium nonanoate, tetrapropylammonium decanoate, tetrapropylammonium oleate, tetrapropylammonium stearate, tetrapropylammonium linoleate, tetrapropylammonium linolenate, tetrapropylammonium benzoate, tetrapropylammonium p-methylbenzoate, tetrapropylammonium p-t-butylbenzoate, tetrapropylammonium phthalate, tetrapropylammonium isophthalate, tetrapropylammonium terephthalate, tetrapropylammonium salicylate, tetrapropylammonium trifluoroacetate, tetrapropylammonium monochloroacetate, tetrapropylammonium dichloroacetate, tetrapropylammonium trichloroacetate, tetrapropylammonium hydroxide, tetrapropylammonium oxalate, tetrapropylammonium malonate, tetrapropylammonium methylmalonate, tetrapropylammonium ethylmalonate, tetrapropylammonium propylmalonate, tetrapropylammonium butylmalonate, tetrapropylammonium dimethylmalonate, tetrapropylammonium diethylmalonate, tetrapropylammonium succinate, tetrapropylammonium methylsuccinate, tetrapropylammonium glutarate, tetrapropylammonium adipate, tetrapropylammonium itaconate, tetrapropylammonium maleate, tetrapropylammonium fumarate, tetrapropylammonium citraconate, tetrapropylammonium citrate, tetrapropylammonium carbonate, tetrapropylammonium chloride, tetrapropylammonium bromide, tetrapropylammonium iodide, tetrapropylammonium nitrate, tetrapropylammonium chlorate, tetrapropylammonium perchlorate, tetrapropylammonium bromate, tetrapropylammonium iodate, bistetrapropylammonium oxalate, bistetrapropylammonium malonate, bistetrapropylammonium methylmalonate, bistetrapropylammonium ethylmalonate, bistetrapropylammonium propylmalonate, bistetrapropylammonium butylmalonate, bistetrapropylammonium dimethylmalonate, bistetrapropylammonium diethylmalonate, bistetrapropylammonium succinate, bistetrapropylammonium methylsuccinate, bistetrapropylammonium glutarate, bistetrapropylammonium adipate, bistetrapropylammonium itaconate, bistetrapropylammonium maleate, bistetrapropylammonium fumarate, bistetrapropylammonium citraconate, bistetrapropylammonium citrate, bistetrapropylammonium carbonate; and tetrabutylammonium formate, tetrabutylammonium acetate, tetrabutylammonium propionate, tetrabutylammonium butanoate, tetrabutylammonium pentanoate, tetrabutylammonium hexanoate, tetrabutylammonium heptanoate, tetrabutylammonium octanoate, tetrabutylammonium nonanoate, tetrabutylammonium decanoate, tetrabutylammonium oleate, tetrabutylammonium stearate, tetrabutylammonium linoleate, tetrabutylammonium linolenate, tetrabutylammonium benzoate, tetrabutylammonium p-methylbenzoate, tetrabutylammonium p-t-butylbenzoate, tetrabutylammonium phthalate, tetrabutylammonium isophthalate, tetrabutylammonium terephthalate, tetrabutylammonium salicylate, tetrabutylammonium trifluoroacetate, tetrabutylammonium monochloroacetate, tetrabutylammonium dichloroacetate, tetrabutylammonium trichloroacetate, tetrabutylammonium hydroxide, tetrabutylammonium oxalate, tetrabutylammonium malonate, tetrabutylammonium methylmalonate, tetrabutylammonium ethylmalonate, tetrabutylammonium propylmalonate, tetrabutylammonium butylmalonate, tetrabutylammonium dimethylmalonate, tetrabutylammonium diethylmalonate, tetrabutylammonium succinate, tetrabutylammonium methylsuccinate, tetrabutylammonium glutarate, tetrabutylammonium adipate, tetrabutylammonium itaconate, tetrabutylammonium maleate, tetrabutylammonium fumarate, tetrabutylammonium citraconate, tetrabutylammonium citrate, tetrabutylammonium carbonate, tetrabutylammonium chloride, tetrabutylammonium bromide, tetrabutylammonium iodide, tetrabutylammonium nitrate, tetrabutylammonium chlorate, tetrabutylammonium perchlorate, tetrabutylammonium bromate, tetrabutylammonium iodate, bistetrabutylammonium oxalate, bistetrabutylammonium malonate, bistetrabutylammonium methylmalonate, bistetrabutylammonium ethylmalonate, bistetrabutylammonium propylmalonate, bistetrabutylammonium butylmalonate, bistetrabutylammonium dimethylmalonate, bistetrabutylammonium diethylmalonate, bistetrabutylammonium succinate, bistetrabutylammonium methylsuccinate, bistetrabutylammonium glutarate, bistetrabutylammonium adipate, bistetrabutylammonium itaconate, bistetrabutylammonium maleate, bistetrabutylammonium fumarate, bistetrabutylammonium citraconate, bistetrabutylammonium citrate, and bistetrabutylammonium carbonate.

Note that the thermal crosslinking accelerators (C) can be used solely in one kind or combinedly in two or more kinds. The addition amount of the thermal crosslinking accelerators (C) is preferably 0.01 to 50 parts by mass, and more preferably 0.1 to 40 parts by mass, relative to 100 parts by mass of the base polymer (i.e., the silicon-containing compound of the component (A) obtained by the above procedure).

To ensure stability of the silicon-containing film-forming composition upon using the pattern process of the present invention, it is necessary to add a monovalent, divalent, or higher organic acid having 1 to 30 carbon atoms as the component (D).

Examples of the organic acid (D) to be added include formic acid, acetic acid, propionic acid, butanoic acid, pentanoic acid, hexanoic acid, heptanoic acid, octanoic acid, nonanoic acid, decanoic acid, oleic acid, stearic acid, linoleic acid, linolenic acid, benzoic acid, phthalic acid, isophthalic acid, terephthalic acid, salicylic acid, trifluoroacetic acid, monochloroacetic acid, dichloroacetic acid, trichloroacetic acid, oxalic acid, malonic acid, methylmalonic acid, ethylmalonic acid, propylmalonic acid, butylmalonic acid, dimethylmalonic acid, diethylmalonic acid, succinic acid, methylsuccinic acid, glutaric acid, adipic acid, itaconic acid, maleic acid, fumaric acid, citraconic acid, and citric acid.

Particularly preferable examples include oxalic acid, maleic acid, formic acid, acetic acid, propionic acid, and citric acid. It is possible to mixingly use two or more kinds of acids, so as to keep the stability.

The addition amount is 0.001 to 25 parts by mass, preferably 0.01 to 15 parts by mass, and more preferably 0.1 to 5 parts by mass, relative to 100 parts by mass of the silicon-containing compound (A) contained in the composition.

Alternatively, the organic acid (D) is preferably blended in a manner to achieve $0 \leq pH \leq 7$, more preferably $0.3 \leq pH \leq 6.5$, and even more preferably $0.5 \leq pH \leq 6$, when evaluated as a pH of the composition.

In the present invention, water may be added to the composition. Addition of water causes the silicon-containing compound to be hydrated, thereby improving lithography performance thereof. The content rate of water in the solvent components of the composition is preferably more than 0 mass % and less than 50 mass %, more preferably 0.3 to 30 mass %, and even more preferably 0.5 to 20 mass %. Such addition amount, the composition can be excellent in uniformity of a coated film and the lithography performance.

The usage amount of all the solvents including water is preferably 100 to 100,000 parts by mass, and particularly 200 to 50,000 parts by mass, relative to 100 parts by mass of the base polymer of the component (A).

In the present invention, it is possible to use a photoacid generator. Concrete examples of photoacid generators to be used in the present invention include a material described in paragraphs (0160) to (0179) of Japanese Patent Laid-Open (kokai) No. 2009-126940.

Further, the silicon-containing film-forming composition can be improved in stability, by adding thereto, as a stabilizer, a monovalent or divalent or higher alcohol having a cyclic ether as a substitutional group, particularly ether compounds represented by the following formulae. Examples thereof include the materials described in paragraphs (0181) to (0184) of Japanese Patent Laid-Open (kokai) No. 2009-126940.

In the present invention, it is possible to blend a surfactant, as required. Concrete examples of such a surfactant include a material described in paragraph (0185) of Japanese Patent Laid-Open (kokai) No. 2009-126940.

The silicon-containing film of the present invention useful as an etching mask can be formed on a substrate from the silicon-containing film-forming composition by spin coating or the like, similarly to a photoresist film. After spin coating, the composition is desirably baked, so as to evaporate the solvent therein, and to promote crosslinking reaction for preventing the film from being mixed with the overlying photoresist film. Baking is to be preferably conducted within a temperature range of 50 to 500° C. and within a time range of 10 to 300 seconds. Particularly preferably, the temperature range is 400° C. or lower for decreased thermal damage against a device to be produced, depending on the structure thereof.

The present invention is configured to use such a composition of the present invention, i.e., the composition for forming silicon-containing film containing the silicon-containing compound (A) and the organic solvent (B), as well as the thermal crosslink accelerator (C) and the organic acid (D) as required, in a manner to form a silicon-containing film; to use a silicon-free resist composition to form a photoresist film on the silicon-containing film; to heat-treat the photoresist film, and subsequently exposing the photoresist film to a high energy beam; and to use a developer comprising an organic solvent to dissolve an unexposed area of the photoresist film, thereby forming a negative pattern.

The patterning process of the present invention is shown in FIG. 1, for example.

In this case, the composition for forming silicon-containing film is used to form a silicon-containing film 20 on a process-targeted workpiece 10 in the present invention as shown in FIG. 1(A), in a manner to further coat a resist composition on the substrate to form a photoresist film 30. Preferably, the resist film is to have a thickness of 10 to 1,000 nm, particularly 20 to 500 nm. The photoresist film is conducted to pre-bake before the exposure, the condition is to be preferably conducted within a temperature range of 80 to 180° C. and within a time range of 10 to 300 seconds.

Usable as the process-targeted workpiece 10 is a semiconductor substrate 11 formed thereon with a metal film, metal carbide film, metal oxide film, metal nitride film, or metal oxide nitride film, as a process-targeted layer (process-targeted portion) 12.

Although a silicon substrate is typically used as the semiconductor substrate, the latter is not particularly limited and it is possible to use a substrate made of a material such as Si, amorphous silicon (α-Si), p-Si, SiO$_2$, SiN, SiON, W, TiN, Al, or the like, which can be different from that of the layer to be processed.

Usable as a metal constituting the process-targeted workpiece is silicon, titanium, tungsten, hafnium, zirconium, chromium, germanium, copper, aluminum, iron, or an alloy thereof, and usable as the process-targeted layer containing such a metal is Si, SiO$_2$, SiN, SiON, SiOC, p-Si, α-Si, TiN, WSi, BPSG, SOG, Cr, CrO, CrON, MoSi, W, W—Si, Al, Cu, Al—Si, or the like, or various low dielectric films, or an etching stopper film therefor, for example, which can each be formed to typically have a thickness of 50 to 10,000 nm, and particularly 100 to 5,000 nm.

Subsequently conducted is exposure to light 40, as shown in FIG. 1(B). Here, it is possible to conduct a pattern formation in the photoresist film by exposure, based on photolithography at a wavelength between 10 nm inclusive and 300 nm inclusive, direct writing by electron beam, or nano-imprinting, or any combination thereof, and most preferably, exposure at 193 nm based on ArF excimer laser is used among them.

In the patterning process of the present invention, it is enough for the photoresist upper layer film to be capable of forming a negative pattern by development using an organic solvent; and in case of using a silicon-containing film derived from the composition of the present invention in an exposure process based on ArF excimer laser, for example, it is possible to use a typical resist composition for ArF excimer laser, as the photoresist upper layer film.

Already known as such a resist composition for ArF excimer laser are numerous candidates including known resins, which are generally classified into poly(meth)acryl resins, COMA (Cyclo Olefin Maleic Anhydride) resins, COMA-(meth)acryl hybrid resins, ROMP (Ring Opening Methathesis Polymerization) resins, polynorbornene resins, and the like; and resist compositions using poly(meth)acryl resins among them are superior to other type resins in terms of resolution performance because the poly(meth)acryl resins each have an alicyclic structure introduced in its side-chain to thereby ensure an etching resistance.

The exposure may be conducted in a dry atmosphere such as in an atmospheric air or in a nitrogen flow, or may be liquid immersion exposure in water.

To be used as a solvent for liquid immersion in ArF immersion lithography, is a liquid such as pure water, alkane, or the like, which has a refractive index of 1 or more and which is highly transparent to the exposure wavelength. In the immersion lithography, pure water or another liquid is inserted between a photoresist film after pre-baking and a projection lens. This enables to design a lens having NA of 1.0 or more, thereby enabling formation of a finer pattern. The immersion lithography is an important technique for prolonging a life of the ArF lithography up to a 45 nm node.

It is noted that, in case of liquid immersion exposure, it is possible to: conduct pure water rinsing (post-soaking) after exposure, so as to remove water droplets left on a photoresist film; conduct pure water rinsing (post-soaking) after formation of a photoresist film, to thereby extract an acid generator or the like from a surface of the photoresist film or to wash away particles therefrom; or form a protective film on a photoresist film after pre-baking, so as to prevent an eluate from the photoresist film to enhance a water slidability of the film surface.

The protective film is required to dissolve in a developer comprising an organic solvent, and such a polymer compound dissolves in an organic solvent-based developer to be described later, which polymer compound comprises repeating units each having a 1,1,1,3,3,3-hexafluoro-2-propanol residue. Particularly, exemplified in Japanese Patent Application Laid-Open Publication No. 2007-25634 is a protective film material having 1,1,1,3,3,3-hexafluoro-2-propanol residues, which material is high in solubility in an organic solvent-based developer.

Adoption of a polymer compound as a composition for forming a protective film, which polymer compound is mixed with an amine compound or amine salt, or which polymer compound is copolymerized with repeating units each having an amine compound or amine salt, will be high in effect to control diffusion of an acid generated from an exposed area of a photoresist into an unexposed area, thereby preventing an opening defect of a hole. Usable as a protective film material containing an amine compound added therein is that described in Japanese Patent Application Laid-Open. Publication No. 2008-3569, and usable as a protective film material copolymerized with an amino group is that described in Japanese Patent Application Laid-Open Publication No. 2007-316448. The amine compound is selectable from among those detailed above as the basic compounds for addition into the photoresist. The amine compound is to be preferably blended in a amount of 0.01 to 10 parts by weight, particularly 0.02 to 8 parts by weight, relative to 100 parts by weight of a base resin.

When an acid evaporated from an exposed area is attached to an unexposed area during PEB to thereby deprotect a protective group at a surface of the unexposed area, it is likely that a surface of a hole after development is bridged and occluded. It is thus effective to utilize a protective film, so as to prevent vaporization of an acid to thereby prevent a defective opening of a hole. Further, a protective film containing an amine compound added therein is capable of effectively preventing vaporization of an acid.

It is preferable to conduct exposure such that an exposure dose is on the order of 1 to 200 mJ/cm$^2$, preferably on the order of 10 to 100 mJ/cm$^2$. Next, post-exposure bake (PEE) is conducted on a hot plate, at 60 to 150° C. for 1 to 5 minutes, preferably at 80 to 120° C. for 1 to 3 minutes.

Further, development is conducted as shown in FIG. 1(C), by using a developer comprising an organic solvent for 0.1 to 3 minutes, preferably for 0.5 to 2 minutes, in the usual manner such as dipping, puddling, spraying, or the like, to form a negative pattern 30a where an unexposed area has been dissolved.

Preferably usable as the developer at this time is one containing, as a component(s), one or more kinds selected from among: ketones such as 2-octanone, 2-nonanone, 2-heptanone, 3-heptanone, 4-heptanone, 2-hexanone, 3-hexanone, diisobutylketone, methylcyclohexanone, acetophenone, and methylacetophenone; ethers such as propyl acetate, butyl acetate, isobutyl acetate, amyl acetate, butenyl acetate, isoamyl acetate, phenyl acetate, propyl formate, butyl formate, isobutyl formate, amyl formate, isoamyl formate, methyl valerate, methyl pentenoate, methyl crotonate, and ethyl crotonate; methyl lactate; ethyl lactate; propyl lactate; butyl lactate; isobutyl lactate; amyl lactate; isoamyl lactate; methyl 2-hydroxy-isobutyrate; ethyl 2-hydroxy-isobutyrate; methyl benzoate; ethyl benzoate; phenyl acetate; benzyl acetate; methyl phenylacetate; benzyl formate; phenylethyl formate; methyl 3-phenylpropionate; benzyl propionate; ethyl phenylacetate; and acetic acid 2-phenylethyl.

Particularly, it is preferable to use a developer containing one kind, or two or more kinds of the aforementioned developer components, in a total amount of 50 wt % or more, from standpoints of improving pattern collapse, and forming a more excellent hole pattern, for example.

It is preferable to conduct rinsing upon termination of the development. Preferable as a rinsing solution is a solvent, which is allowed to be mixedly dissolved in the developer, without dissolution of a photoresist film. Preferably used as such a solvent is one, based on an alcohol having 3 to 10 carbon atoms, an ether compound having 8 to 12 carbon atoms, or an alkane, alkene, alkyne, or aromatic compound having 6 to 12 carbon atoms.

Examples of the alkane having 6 to 12 carbon atoms include hexane, heptane, octane, nonane, decane, undecane, dodecane, methyl cyclopentane, dimethyl cyclopentane, cyclohexane, methyl cyclohexane, dimethyl cyclohexane, cycloheptane, cyclooctane, and cyclononane; the alkene having 6 to 12 carbon atoms include hexene, heptene, octene, cyclohexene, methyl cyclohexene, dimethyl cyclohexene, cycloheptene, and cyclooctene; and the alkyne having 6 to 12 carbon atoms include hexyne, heptyne, and octyne.

Examples of the alcohol having 3 to 10 carbon atoms include n-propyl alcohol, isopropyl alcohol, 1-butyl alcohol, 2-butyl alcohol, isobutyl alcohol, tert-butyl alcohol, 1-pentanol, 2-pentanol, 3-pentanol, tert-amyl alcohol, neopentyl alcohol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl 1-butanol, 3,3-dimethyl 2-butanol, 2-diethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, cyclohexanol, and 1-octanol.

Examples of the ether compound having 8 to 12 carbon atoms selected from dibutylether, di-iobutylether, di-sec-butylether, dipentylether, diisopentylether, di-dec-pentylether, di-t-amyltether, and dihexylether.

In addition to the above-mentioned solvents, it is also possible to use a solvent based on an aromatic compound such as toluene, xylene, ethylbenzene, isopropylbenzene, t-butylbenzene, or mesitylene.

In case of using a photoresist film as an etching mask in the present invention, etching is conducted by using a gas containing, as a main component, a fluorine-containing gas such as a flon-based gas. The silicon-containing film formed by using the composition for forming silicon-containing film of the present invention is large in etching rate by the gas, thereby exhibiting a feature that the photoresist upper layer film is less in film loss.

In the multi-layer resist method configured to use the composition for forming silicon-containing film of the present invention, it is also possible to provide a lower layer film between the silicon-containing film comprising the composition for forming silicon-containing film of the present invention and a process-targeted workpiece. In turn, in case of using the lower layer film as an etching mask for a targeted substrate, this lower layer film is a film for again transferring a resist pattern having been formed and thereafter transferred into the silicon-containing film, so that this lower layer film is required to have such a characteristic that the lower layer film can be etched under an etching condition where the silicon-containing film exhibits a higher etching resistance, and such a characteristic that the lower layer film itself in turn exhibits a higher etching resistance under a condition for etching the targeted substrate. As such, although the lower layer film is preferably an organic film having an aromatic structure, the lower layer film may be not only an organic film but also a silicon-containing material when the lower layer film is a sacrificial film, for example, insofar as the silicon-containing material has a silicon content of 15 wt % or less.

Such organic films to be lower layer films, many resins represented by novolak resins in addition to a 4,4'-(9H-fluoren-9-ylidene)bisphenol novolak resin (molecular weight of 11,000) described in Japanese Patent Laid-Open (kokai) No. 2005-128509 are known as resist lower layer film materials for the bilayer resist process and three-layer resist process, such that any of them are usable. Further, when it is intended to provide a heat resistance higher than a typical novolak, it is also possible to include a polycyclic skeleton such as 4,4'-(9H-fluoren-9-ylidene)bisphenol novolak resin, and to select a polyimide resin (Japanese Patent Laid-Open (kokai) No. 2004-153125, for example).

The organic film can be formed on the substrate by using a composition solution in the same manner as the photoresist composition, such as by spin coating. After forming the resist lower layer film by spin coating or the like, it is desirable to bake it to evaporate an organic solvent therefrom. Baking is to be preferably conducted within a temperature range of 80 to 300° C. and within a time range of 10 to 300 seconds.

Note that the thickness of the lower layer film is 5 nm or more, particularly preferably 20 nm or more to 50,000 nm or less without particularly limited thereto though the thickness varies depending on the etching condition; the thickness of the silicon-containing film of the present invention is to be 1 nm or more to 500 nm or less, preferably to be 300 nm or less, more preferably to be 200 nm or less; and the thickness of a photoresist film is preferably between 1 nm or more and 200 nm or less.

The three-layer resist process using the silicon-containing film of the present invention is configured as follows. In this process, an organic lower layer film is firstly created on a process-targeted workpiece, by spin coating or the like. The organic lower layer film is desirably high in etching resistance because the organic lower layer film acts as a mask upon etching of the process-targeted workpiece, and the organic lower layer film is to be desirably cross-linked by heat or acid after spin coating because the organic lower layer film is required not to be mixed with an overlying silicon-containing film.

On the organic lower layer film, the silicon-containing film to be obtained from the composition of the present invention and a photoresist film are father formed on the film by the above-described procedures. According to a usual manner, the photoresist film is: pattern exposed by adopting a light source corresponding to the photoresist film such as KrF excimer laser light, ArF excimer laser light, $F_2$ laser light, or EUV light, in particular, photolithography at a wavelength between 10 nm inclusive and 300 nm inclusive, direct writing by electron beam, or nano-imprinting, or any combination thereof; heat-treated under the condition adapted to the individual photoresist film, if necessary; and then subjected to a developing operation by a developer comprising an organic solvent, to allow for obtainment of a negative resist pattern.

Next, etching is conducted for the silicon-containing film, by using this resist pattern as an etching mask, and under a dry etching condition such as dry etching by a fluorine-based gas plasma where the etching speed of the silicon-containing film is significantly higher than that of the photoresist film. As a result, a silicon-containing film pattern can be obtained, substantially without undergoing an affection of a pattern change due to side etching of the photoresist film.

Next, using the silicon-containing film pattern having the above obtained resist film pattern transferred thereto as a mask, the silicon-containing film is subjected to conduction of dry etching under a condition that the etching speed of the organic film as the resist lower layer film is significantly higher than that of the silicon-containing film, such as reactive dry etching by gas plasma containing oxygen, and reactive dry etching by gas plasma containing hydrogen-nitrogen, to thereby etch the underlying organic lower layer film. By this etching process, a pattern of the organic lower layer film is obtained, and simultaneously therewith, the resist layer as the uppermost layer is typically lost.

Further, the thus obtained organic film pattern is used as an etching mask to conduct dry etching of the process-targeted workpiece such as fluorine-based dry etching, or chlorine-based dry etching, thereby enabling precise etching of the process-targeted workpiece and therefore transferring the pattern.

It is also possible to form, as the lower layer film, an organic hard mask containing carbon as a main component, by a CVD method. Also in that case, it is possible to transfer the pattern onto the process-targeted workpiece in the same procedure as the above.

EXAMPLES

Although Synthesis examples, Comparative Synthesis Examples, Examples, and Comparative examples will be shown and the present invention will be explained in detail hereafter, the present invention is not restricted to the following Examples.

Note that the symbol "%" in the Examples represents a mass %, and the molecular weight measurement was based on GPC.

Synthesis of Siloxane Polymer

Synthesis Examples 1

Into a mixture of 40 g of ethanol, 1 g of methanesulfonic acid, and 50 g of deionized water was added a mixture of 2 g of phenyl trimethoxy silane, 6.8 g of 1,2-bis(trimethoxysilyl) ethan, 7.5 g of triisopropyl borate, and 20.8 g of tetraethoxy silane; and then the resulting mixture was kept at 40° C. for 12 hours for hydrolysis-condensation. After the reaction, 100 g of propylene glycol methyl ether was added thereinto and then by-produced alcohol was removed by distillation under reduced pressure. Then, 100 mL of ethyl acetate and 300 g of propylene glycol methyl ether were added thereinto, and then a water layer was separated. Into the organic layer remained was added 100 mL of ion-exchanged water; the resulting solution was agitated, settled, and separated into layers. This operation was repeated for 3 times. The organic layer remained was concentrated under reduced pressure to obtain 100 g of a propylene glycol methyl ether solution of silicon-containing compound 1 (10% of polymer concentration). Methanesulfonate ion could not be detected in the obtained solution by an ion chromatography. Polystyrene equivalent molecular weight of the compound was 3000 (Mw).

Synthesis Examples 2 to 16, and Comparative Synthesis Examples 1 to 6

Each synthesis was conducted in the same manner as Synthesis Example 1 by using monomers shown in Table 1-1 to Table 1-3, to obtain the intended compound.

TABLE 1-1

| Synthesis Example | Compound of general formula (A-1) | Compound of general formula (A-2-1) | Compound of general formula (A-2-2) | Product |
|---|---|---|---|---|
| 1 | (H$_3$CO)$_3$Si—/—Si(OCH$_3$)$_3$<br>6.8 g | 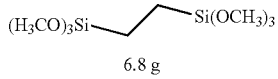—Si(OCH$_3$)$_3$<br>2.0 g<br>Si(OEt)$_4$<br>20.8 g | (i-PrO)$_3$B<br>7.5 g | silicon-containing compound 1<br>Mw = 3000 |
| 2 | (H$_3$CO)$_3$Si—/—Si(OCH$_3$)$_3$<br>16.8 g | 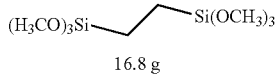—Si(OCH$_3$)$_3$<br>2.0 g<br>Si(OEt)$_4$<br>20.8 g | Ti(OC$_4$H$_9$)$_4$<br>13.6 g | silicon-containing compound 2<br>Mw = 2100 |
| 3 | (H$_3$CO)$_3$Si—/—Si(OCH$_3$)$_3$<br>4.8 g | 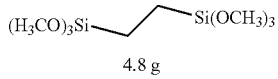—Si(OCH$_3$)$_3$<br>2.0 g<br>Si(OEt)$_4$<br>20.8 g | Ge(OC$_4$H$_9$)$_4$<br>14.6 g | silicon-containing compound 3<br>Mw = 2200 |
| 4 | (H$_3$CO)$_3$Si—/—Si(OCH$_3$)$_3$<br>4.8 g | 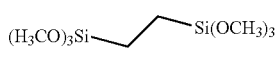—Si(OCH$_3$)$_3$<br>2.0 g<br>Si(OEt)$_4$<br>20.8 g | P$_2$O$_5$<br>11.4 g | silicon-containing compound 4<br>Mw = 2800 |

TABLE 1-1-continued

| Synthesis Example | Compound of general formula (A-1) | Compound of general formula (A-2-1) | Compound of general formula (A-2-2) | Product |
|---|---|---|---|---|
| 5 | (H$_3$CO)$_3$Si—CH$_2$CH$_2$—Si(OCH$_3$)$_3$<br>6.8 g | C$_6$H$_5$—Si(OCH$_3$)$_3$<br>2.0 g<br>Si(OEt)$_4$<br>20.8 g | Al(OC$_4$H$_9$)$_3$<br>9.9 g | silicon-containing compound 5<br>Mw = 2600 |
| 6 | (H$_3$CO)$_3$Si—CH$_2$CH$_2$—Si(OCH$_3$)$_3$<br>9.8 g | C$_6$H$_5$—Si(OCH$_3$)$_3$<br>2.0 g<br>H$_3$C—Si(OCH$_3$)$_3$<br>5.5 g<br>Si(OEt)$_4$<br>20.8 g | not contain | silicon-containing compound 6<br>Mw = 2800 |
| 7 | (H$_3$CO)$_3$Si—(CH$_2$)$_3$—Si(CH$_3$)(OCH$_3$)$_2$<br>6.7 g | C$_6$H$_5$—Si(OCH$_3$)$_3$<br>2.0 g<br>H$_3$C—Si(OCH$_3$)$_3$<br>5.5 g<br>Si(OEt)$_4$<br>20.8 g | not contain | silicon-containing compound 7<br>Mw = 2400 |
| 8 | (H$_3$CO)$_2$Si(CH$_3$)—(CH$_2$)$_6$—Si(CH$_3$)(OCH$_3$)$_2$<br>3.4 g | C$_6$H$_5$—Si(OCH$_3$)$_3$<br>2.0 g<br>H$_3$C—Si(OCH$_3$)$_3$<br>5.5 g<br>Si(OEt)$_4$<br>20.8 g | not contain | silicon-containing compound 8<br>Mw = 2500 |

TABLE 1-2

| Synthesis Example | Compound of general formula (A-1) | Compound of general formula (A-2-1) | Compound of general formula (A-2-2) | Product |
|---|---|---|---|---|
| 9 | (C$_2$H$_5$O)$_3$Si—C$_6$H$_4$—Si(OC$_2$H$_5$)$_3$<br>10.1 g | H$_3$C—Si(OCH$_3$)$_3$<br>1.4 g<br>Si(OEt)$_4$<br>20.8 g | (i-PrO)$_3$B<br>7.5 g | silicon-containing compound 9<br>Mw = 2500 |
| 10 | (C$_2$H$_5$O)$_3$Si—C$_6$H$_4$—Si(OC$_2$H$_5$)$_3$<br>18.1 g | H$_3$C—Si(OCH$_3$)$_3$<br>1.4 g<br>Si(OEt)$_4$<br>20.8 g | Ti(OC$_4$H$_9$)$_4$<br>13.6 g | silicon-containing compound 10<br>Mw = 2800 |

TABLE 1-2-continued

| Synthesis Example | Compound of general formula (A-1) | Compound of general formula (A-2-1) | Compound of general formula (A-2-2) | Product |
|---|---|---|---|---|
| 11 | $(C_2H_5O)_3Si$—⟨phenylene⟩—$Si(OC_2H_5)_3$ <br> 8.0 g | $H_3C$—$Si(OCH_3)_3$ 1.4 g <br> $Si(OEt)_4$ 20.8 g | $Ge(OC_4H_9)_4$ 14.6 g | silicon-containing compound 11 <br> Mw = 3000 |
| 12 | $(C_2H_5O)_3Si$—⟨phenylene⟩—$Si(OC_2H_5)_3$ <br> 10.1 g | $H_3C$—$Si(OCH_3)_3$ 1.4 g <br> $Si(OEt)_4$ 20.8 g | $P_2O_5$ 11.4 g | silicon-containing compound 12 <br> Mw = 2500 |
| 13 | $(C_2H_5O)_3Si$—⟨phenylene⟩—$Si(OC_2H_5)_3$ <br> 9.2 g | $H_3C$—$Si(OCH_3)_3$ 1.4 g <br> $Si(OEt)_4$ 20.8 g | $Al(OC_4H_9)_3$ 9.9 g | silicon-containing compound 13 <br> Mw = 2500 |
| 14 | $(C_2H_5O)_3Si$—⟨phenylene⟩—$Si(OC_2H_5)_3$ <br> 12.1 g | $H_3C$—$Si(OCH_3)_3$ 6.8 g <br> $Si(OEt)_4$ 20.8 g | not contain | silicon-containing compound 14 <br> Mw = 2400 |
| 15 | $(C_2H_5O)_3SiH_2C$—⟨phenylene⟩—$CH_2Si(OC_2H_5)_3$ <br> 6.7 g | $H_3C$—$Si(OCH_3)_3$ 6.8 g <br> $Si(OEt)_4$ 20.8 g | not contain | silicon-containing compound 15 <br> Mw = 2100 |
| 16 | $(H_3CO)_2Si(CH_3)$—$CH_2CH_2$—⟨phenylene⟩—$CH_2CH_2$—$Si(CH_3)(OCH_3)_2$ <br> 5.4 g | $H_3C$—$Si(OCH_3)_3$ 6.8 g <br> $Si(OEt)_4$ 20.8 g | not contain | silicon-containing compound 16 <br> Mw = 2500 |

TABLE 1-3

| Comparative Synthesis Example | Compound of general formula (A-1) | Compound of general formula (A-2-1) | Compound of general formula (A-2-2) | Product |
|---|---|---|---|---|
| 1 | not contain | ⟨phenyl⟩—$Si(OCH_3)_3$ 2.0 g <br> $Si(OEt)_4$ 20.8 g | $(i\text{-}PrO)_3B$ 7.5 g | silicon-containing compound 17 <br> Mw = 3000 |
| 2 | not contain | ⟨phenyl⟩—$Si(OCH_3)_3$ 2.0 g <br> $Si(OEt)_4$ 20.8 g | $Ti(OC_4H_9)_4$ 13.6 g | silicon-containing compound 18 <br> Mw = 2500 |
| 3 | not contain | ⟨phenyl⟩—$Si(OCH_3)_3$ 2.0 g <br> $Si(OEt)_4$ 20.8 g | $Ge(OC_4H_9)_4$ 14.6 g | silicon-containing compound 19 <br> Mw = 2200 |
| 4 | not contain | ⟨phenyl⟩—$Si(OCH_3)_3$ 2.0 g <br> $Si(OEt)_4$ 20.8 g | $P_2O_5$ 11.4 g | silicon-containing compound 20 <br> Mw = 2900 |

TABLE 1-3-continued

| Comparative Synthesis Example | Compound of general formula (A-1) | Compound of general formula (A-2-1) | Compound of general formula (A-2-2) | Product |
|---|---|---|---|---|
| 5 | not contain | Ph—Si(OCH₃)₃ 2.0 g<br>Si(OEt)₄ 20.8 g | Al(OC₄H₉)₃ 9.9 g | silicon-containing compound 21<br>Mw = 3000 |
| 6 | not contain | Ph—Si(OCH₃)₃ 2.0 g<br>H₃C—Si(OCH₃)₃ 12.3 g<br>Si(OEt)₄ 20.8 g | not contain | silicon-containing compound 22<br>Mw = 2100 |

Preparation of Composition Solvent for Forming Silicon-Containing Film

The silicon-containing compounds 1 to 22 obtained in the Synthesis Examples and the Comparative Synthesis Example, an organic acid, a thermal crosslinking accelerator, a solvent, and an additive were mixed with one another at ratios listed in Table 2-1 to Table 2-3, respectively, followed by filtration by a filter made of fluororesin of a 0.1 m size, to prepare silicon-containing film-forming composition solutions named Sol. 1 to 37, respectively.

TABLE 2-1

| No. | Silicon-containing compound (parts by mass) | Thermal crosslinking accelerator (parts by mass) | Organic acid (parts by mass) | Solvent (parts by mass) | Water (parts by mass) |
|---|---|---|---|---|---|
| Sol. 1 | Compound 1 (4.0) | TPSOH (0.04) | maleic acid (0.04) | PGME (150) | Water (15) |
| Sol. 2 | Compound 1 (4.0) | TPSHCO₃ (0.04) | oxalic acid (0.04) | PGME (150) | Water (15) |
| Sol. 3 | Compound 1 (4.0) | TPSOx (0.04) | maleic acid (0.04) | PGME (150) | Water (15) |
| Sol. 4 | Compound 1 (4.0) | TPSTFA (0.04) | maleic acid (0.04) | PGME (150) | Water (15) |
| Sol. 5 | Compound 1 (4.0) | TPSOCOPh (0.04) | oxalic acid (0.04) | PGME (150) | Water (15) |
| Sol. 6 | Compound 1 (4.0) | TPSH₂PO₄ (0.04) | oxalic acid (0.04) | PGME (150) | Water (15) |
| Sol. 7 | Compound 1 (4.0) | QMAMA (0.04) | maleic acid (0.04) | PGME (150) | Water (15) |
| Sol. 8 | Compound 1 (4.0) | QBANO₃ (0.04) | maleic acid (0.04) | PGME (150) | Water (15) |
| Sol. 9 | Compound 1 (4.0) | QMATFA (0.04) | maleic acid (0.04) | PGME (150) | Water (15) |
| Sol. 10 | Compound 1 (4.0) | Ph₂ICl (0.04) | maleic acid (0.04) | PGME (150) | Water (15) |
| Sol. 11 | Compound 1 (4.0) | not contain | maleic acid (0.04) | PGME (150) | Water (15) |
| Sol. 12 | Compound 2 (4.0) | TPSMA (0.04) | maleic acid (0.04) | PGME (150) | Water (15) |
| Sol. 13 | Compound 3 (4.0) | TPSMA (0.04) | maleic acid (0.04) | PGME (150) | Water (15) |

TABLE 2-2

| No. | Silicon-containing compound (parts by mass) | Thermal crosslinking accelerator (parts by mass) | Organic acid (parts by mass) | Solvent (parts by mass) | Water (parts by mass) |
|---|---|---|---|---|---|
| Sol. 14 | Compound 4 (4.0) | TPSMA (0.04) | maleic acid (0.04) | PGME (150) | Water (15) |
| Sol. 15 | Compound 5 (4.0) | TPSMA (0.04) | maleic acid (0.04) | PGME (150) | Water (15) |
| Sol. 16 | Compound 6 (4.0) | TPSMA (0.04) | maleic acid (0.04) | PGME (150) | Water (15) |
| Sol. 17 | Compound 7 (4.0) | TPSMA (0.04) | maleic acid (0.04) | PGME (150) | Water (15) |
| Sol. 18 | Compound 8 (4.0) | TPSMA (0.04) | maleic acid (0.04) | PGME (150) | Water (15) |
| Sol. 19 | Compound 9 (4.0) | TPSMA (0.04) | maleic acid (0.04) | PGME (150) | Water (15) |
| Sol. 20 | Compound 10 (4.0) | TPSMA (0.04) | maleic acid (0.04) | PGME (150) | Water (15) |
| Sol. 21 | Compound 11 (4.0) | TPSMA (0.04) | maleic acid (0.04) | PGME (150) | Water (15) |
| Sol. 22 | Compound 12 (4.0) | TPSMA (0.04) | maleic acid (0.04) | PGME (150) | Water (15) |
| Sol. 23 | Compound 13 (4.0) | TPSMA (0.04) | maleic acid (0.04) | PGME (150) | Water (15) |
| Sol. 24 | Compound 14 (4.0) | TPSMA (0.04) | maleic acid (0.04) | PGME (150) | Water (15) |
| Sol. 25 | Compound 15 (4.0) | TPSMA (0.04) | maleic acid (0.04) | PGME (150) | Water (15) |
| Sol. 26 | Compound 16 (4.0) | TPSMA (0.04) | maleic acid (0.04) | PGME (150) | Water (15) |

TABLE 2-3

| No. | Silicon-containing compound (parts by mass) | Thermal crosslinking accelerator (parts by mass) | Organic acid (parts by mass) | Solvent (parts by mass) | Water (parts by mass) |
|---|---|---|---|---|---|
| Sol. 27 | Compound 17 (4.0) | TPSMA (0.04) | maleic acid (0.04) | PGME (150) | Water (15) |
| Sol. 28 | Compound 18 (4.0) | TPSMA (0.04) | maleic acid (0.04) | PGME (150) | Water (15) |
| Sol. 29 | Compound 19 (4.0) | TPSMA (0.04) | maleic acid (0.04) | PGME (150) | Water (15) |
| Sol. 30 | Compound 20 (4.0) | TPSMA (0.04) | maleic acid (0.04) | PGME (150) | Water (15) |
| Sol. 31 | Compound 21 (4.0) | TPSMA (0.04) | maleic acid (0.04) | PGME (150) | Water (15) |
| Sol. 32 | Compound 22 (4.0) | TPSMA (0.04) | maleic acid (0.04) | PGME (150) | Water (15) |
| Sol. 33 | Compound 1 (2.0)<br>Compound 16 (2.0) | TPSMA (0.04) | maleic acid (0.04) | PGME (150) | Water (15) |
| Sol. 34 | Compound 4 (2.0)<br>Compound 9 (2.0) | TPSMA (0.04) | maleic acid (0.04) | PGME (150) | Water (15) |
| Sol. 35 | Compound 7 (2.0)<br>Compound 14 (2.0) | TPSMA (0.04) | maleic acid (0.04) | PGME (150) | Water (15) |
| Sol. 36 | Compound 7 (2.0)<br>Compound 17 (2.0) | TPSMA (0.04) | maleic acid (0.04) | PGME (150) | Water (15) |

TABLE 2-3-continued

| No. | Silicon-containing compound (parts by mass) | Thermal cross-linking accelerator (parts by mass) | Organic acid (parts by mass) | Solvent (parts by mass) | Water (parts by mass) |
|---|---|---|---|---|---|
| Sol. 37 | Compound 17 (2.0) Compound 22 (2.0) | TPSMA (0.04) | maleic acid (0.04) | PGME (150) | Water (15) |

TPSOH: triphenylsulfonium hydroxide
TPSHCO$_3$: mono-(triphenylsulfonium) carbonate
TPSOx: mono-(triphenylsulfonium) oxalic acid
TPSTFA: triphenylsulfonium trifluoroacetic acid
TPSOCOPh: triphenylsulfonium benzoic acid
TPSH$_2$PO$_4$: mono-(triphenylsulfonium) phosphate
TPSMA: mono-(triphenylsulfonium) maleic acid
QMAMA: mono-(tetramethyl ammonium) maleic acid
QMATFA: tetramethyl ammonium trifluoroacetic acid
QBANO$_3$: tetrabuthyl ammonium nitric acid
Ph$_2$ICl: diphenyl iodonium chloride
PGME: propyleneglycol monomethyl ether Measurement of Contact Angle Solutions Sol.1 to Sol.37 of composition for forming silicon-containing film, were coated and heated at 240° C. for 60 seconds to prepare silicon-containing films Film1 to Film37 each having a thickness of 35 nm, respectively, followed by measurement of a contact angle with pure water (Table 3).

Further, ArF resist solutions listed in Table 4 were each coated, baked at 100° C. for 60 seconds to prepare a photoresist film having a thickness of 100 nm, followed by measurement of a contact angle with pure water. Next, the same resist films were each subjected to exposure over a whole surface by an ArF liquid immersion exposure apparatus (NSR-S610C; manufactured by Nikon Corp.), and to baking (PEB) at 100° C. for 60 seconds, to thereby prepare an ArF resist film having lost an acid leaving group, followed by measurement of a contact angle with pure water (Table 3).

TABLE 3

| No. | contact angle |
|---|---|
| Film1 | 55° |
| Film2 | 31° |
| Film3 | 62° |
| Film4 | 65° |
| Film5 | 52° |
| Film6 | 45° |
| Film7 | 50° |
| Film8 | 58° |
| Film9 | 51° |
| Film10 | 39° |
| Film11 | 25° |
| Film12 | 26° |
| Film13 | 64° |
| Film14 | 68° |
| Film15 | 50° |
| Film16 | 41° |
| Film17 | 52° |
| Film18 | 64° |
| Film19 | 53° |
| Film20 | 33° |
| Film21 | 65° |
| Film22 | 53° |
| Film23 | 61° |
| Film24 | 44° |
| Film25 | 54° |
| Film26 | 63° |
| Film27 | 70° |
| Film28 | 71° |
| Film29 | 74° |
| Film30 | 74° |
| Film31 | 73° |
| Film32 | 70° |
| Film33 | 61° |
| Film34 | 54° |
| Film35 | 54° |
| Film36 | 63° |
| Film37 | 70° |
| unexposed PR-1 | 71° |
| unexposed PR-2 | 73° |
| exposed PR-1 | 53° |
| exposed PR-2 | 56° |

As shown in Table 3, the silicon-containing films obtained from the silicon-containing compounds produced to contain the compound of the general formula (A-1) as one of monomer components, had contact angles between 20° inclusive and 70° exclusive, respectively. The contact angles of the ArF resists after exposure were lowered to values between 50° and 60°, by about 20° as compared to those of the resist films before exposure, respectively.

Patterning Test I

Examples 1-1 to 1-20

Comparative Examples 1-1 to 1-7

Formed on a silicon wafer was a spin-on carbon film ODL-50 (carbon content: 80 wt %) produced by Shin-Etsu Chemical Co., Ltd., at a film thickness of 200 nm. Coated thereon were the Solutions Sol.11 to Sol.37 of composition for forming silicon-containing film, followed by heating at 240° C. for 60 seconds, to produce silicon-containing films Film11 to Film37 each having a thickness of 35 nm, respectively.

Further coated thereon were ArF resist solutions listed in the following Table 4, followed by baking at 100° C. for 60 seconds, thereby forming photoresist layers each having a thickness of 100 nm, respectively.

Next, each photoresist layer was subjected to: exposure by an ArF liquid immersion exposure apparatus (NSR-S610C; manufactured by Nikon Corp., NA: 1.30; σ: 0.98/0.65; 35° dipole polarized illumination; and 6% halftone phase-shift mask); baking (PEB) at 100° C. for 60 seconds; ejection of butyl acetate as a developer from a development nozzle to the photoresist layer for 3 seconds while rotating it at 30 rpm; subsequent conduction of puddle development for 27 seconds, by stopping the rotation; spin-drying, after rinsing by diisoamyl ether; baking at 100° C. for 20 seconds, thereby evaporating the rinsing solvent.

Obtained by this patterning was a negative type of 43 nm line-and-space pattern at 1:1. This pattern was subjected to measurement of dimension by an electron microscope (S-9380) manufactured by Hitachi High-Technologies Corporation.

TABLE 4

| No. | Polymer (parts by mass) | Acid generator (parts by mass) | Base (parts by mass) | Water-shedding polymer (parts by mass) | Solvent (parts by mass) |
|---|---|---|---|---|---|
| PR-1 | ArF resist polymer 1 (100) | PAG1 (10.0) | Quencher (2.0) | water-shedding polymer (4.0) | PGMEA (2,200) |

TABLE 4-continued

| No. | Polymer (parts by mass) | Acid generator (parts by mass) | Base (parts by mass) | Water-shedding polymer (parts by mass) | Solvent (parts by mass) |
|---|---|---|---|---|---|
| PR-2 | ArF resist polymer 2 (100) | PAG1 (10.0) | Quencher (2.0) | water-shedding polymer (4.0) | PGMEA (2,200) |

ArF resist polymer 1:

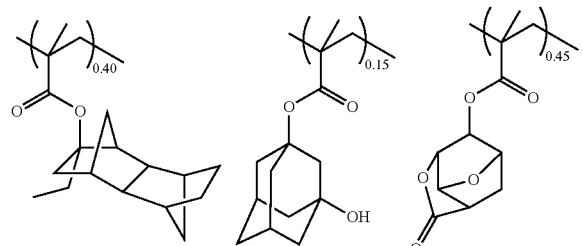

Molecular weight (Mw) = 8,600
Distribution (Mw/Mn) = 1.88

ArF resist polymer 2:

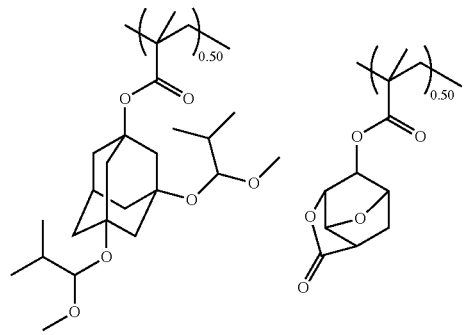

Molecular weight (Mw) = 8,900
Distribution (Mw/Mn) = 1.93

Acid generator: PAG1

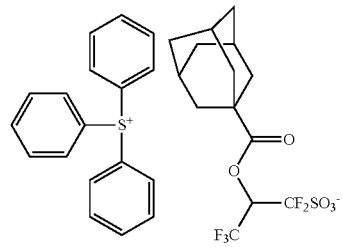

Base: Quencher

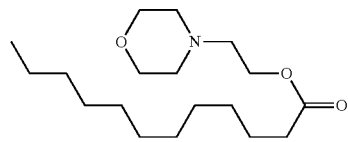 [SMILES: CCCCCCCCCCCC(=O)OCCN1CCOCC1]

Water-shedding polymer:

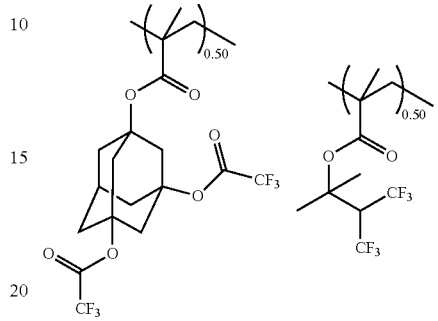

Molecular weight (Mw) = 8,800
Distribution (Mw/Mn) = 1.68

TABLE 5-1

| | Silicon-containing film | ArF resist | Pattern profile of cross section after development | Pattern collapse |
|---|---|---|---|---|
| Example 1-1 | Film11 | PR-1 | vertical profile | free |
| Example 1-2 | Film12 | PR-1 | vertical profile | free |
| Example 1-3 | Film13 | PR-1 | vertical profile | free |
| Example 1-4 | Film14 | PR-1 | vertical profile | free |
| Example 1-5 | Film15 | PR-1 | vertical profile | free |
| Example 1-6 | Film16 | PR-1 | vertical profile | free |
| Example 1-7 | Film17 | PR-1 | vertical profile | free |
| Example 1-8 | Film18 | PR-1 | vertical profile | free |
| Example 1-9 | Film19 | PR-1 | vertical profile | free |
| Example 1-10 | Film20 | PR-1 | vertical profile | free |
| Example 1-11 | Film21 | PR-2 | vertical profile | free |
| Example 1-12 | Film22 | PR-2 | vertical profile | free |
| Example 1-13 | Film23 | PR-2 | vertical profile | free |
| Example 1-14 | Film24 | PR-2 | vertical profile | free |
| Example 1-15 | Film25 | PR-2 | vertical profile | free |
| Example 1-16 | Film26 | PR-2 | vertical profile | free |
| Example 1-17 | Film33 | PR-2 | vertical profile | free |
| Example 1-18 | Film34 | PR-2 | vertical profile | free |
| Example 1-19 | Film35 | PR-2 | vertical profile | free |
| Example 1-20 | Film36 | PR-2 | vertical profile | free |

TABLE 5-2

| | Silicon-containing film | ArF resist | Pattern profile of cross section after development | Pattern collapse |
|---|---|---|---|---|
| Comparative Example 1-1 | Film27 | PR-1 | undercut profile | occurrence |
| Comparative Example 1-2 | Film28 | PR-1 | negative profile | occurrence |
| Comparative Example 1-3 | Film29 | PR-1 | undercut profile | occurrence |
| Comparative Example 1-4 | Film30 | PR-1 | undercut profile | occurrence |
| Comparative Example 1-5 | Film31 | PR-1 | negative profile | occurrence |
| Comparative Example 1-6 | Film32 | PR-1 | undercut profile | occurrence |
| Comparative Example 1-7 | Film37 | PR-1 | undercut profile | occurrence |

As exemplified in Table 5-1, it was possible to obtain a resist profile in a vertical shape, in each of Examples 1-1 to 1-20 using the silicon-containing films having contact angles between 20° inclusive and 70° exclusive, respectively. It was further recognized that the patterns were free of collapse.

In turn, in Comparative Examples 1-1 to 1-7 having contact angles of 70° or larger, respectively, as shown in Table 5-2, pattern profiles were each in an undercut shape or negative shape, with occurrence of pattern collapse.

Patterning Test II

Examples 2-1 to 2-12

Instead of the developer (butyl acetate) noted in the above Patterning Test I, developers listed below were used in the same procedure as the Patterning Test I, thereby each obtaining a negative type of 43 nm line-and-space pattern at 1:1.

TABLE 6

| | Silicon-containing film | ArF Resist | Developer | Pattern profile of cross section after development | Pattern collapse |
|---|---|---|---|---|---|
| Example 2-1 | Film11 | PR-1 | 2-heptanone | vertical profile | free |
| Example 2-2 | Film11 | PR-1 | methyl benzoate | vertical profile | free |
| Example 2-3 | Film11 | PR-2 | ethyl benzoate | vertical profile | free |
| Example 2-4 | Film11 | PR-2 | phenyl acetate | vertical profile | free |
| Example 2-5 | Film17 | PR-1 | benzyl acetate | vertical profile | free |
| Example 2-6 | Film17 | PR-1 | methyl phenyl acetate | vertical profile | free |
| Example 2-7 | Film11 | PR-1 | methyl benzoate:butyl acetate = 6:4 | vertical profile | free |
| Example 2-8 | Film11 | PR-1 | methyl benzoate:2-heptanone = 5:5 | vertical profile | free |
| Example 2-9 | Film25 | PR-1 | methyl benzoate:butyl acetate = 6:4 | vertical profile | free |
| Example 2-10 | Film25 | PR-1 | methyl benzoate:2-heptanone = 5:5 | vertical profile | free |
| Example 2-11 | Film25 | PR-2 | methyl benzoate:butyl acetate = 6:4 | vertical profile | free |
| Example 2-12 | Film25 | PR-2 | methyl benzoate:2-heptanone = 5:5 | vertical profile | free |

As shown in Table 6, it was possible in the present invention to obtain resist patterns each having a profile in a vertical shape without pattern collapse, even by using various developers.

Pattern Etching Test

Example 3-1 to 3-20

Comparative Example 3-1 to 3-7

Formed on a silicon wafer was a spin-on carbon film ODL-50 (carbon content: 80 wt %) produced by Shin-Etsu Chemical Co., Ltd., at a film thickness of 200 nm. Coated thereon were the Solutions Sol.11 to Sol.37 of composition for forming silicon-containing film, followed by heating at 240° C. for 60 seconds, to produce silicon-containing films Film11 to Film37 each having a thickness of 35 nm, respectively.

Further coated thereon were ArF resist solutions listed in the following Table 4, followed by baking at 100° C. for 60 seconds, thereby forming photoresist layers each having a thickness of 100 nm, respectively.

Next, each photoresist layer was subjected to: exposure by an ArF liquid immersion exposure apparatus (NSR-S610C; manufactured by Nikon Corp., NA: 1.30; σ: 0.98/0.65; 35° dipole polarized illumination; and 6% halftone phase-shift mask); baking (PEB) at 100° C. for 60 seconds; ejection of butyl acetate as a developer from a development nozzle to the photoresist layer for 3 seconds while rotating it at 30 rpm; subsequent conduction of puddle development for 27 seconds, by stopping the rotation; spin-drying, after rinsing by diisoamyl ether; baking at 100° C. for 20 seconds, thereby evaporating the rinsing solvent.

Obtained by this patterning was a negative type of 43 nm line-and-space pattern at 1:1.

The silicon-containing film was dry etched by using a resist pattern as a mask under the following etching condition (1) followed by the following etching condition (2); thereby transferring the pattern to spin-on-carbon film. The cross-section form of the pattern was observed by an electron microscope (8-9380, manufactured by Hitachi, Ltd.) and pattern roughness after etching was observed by an electron microscope (CG4000, manufactured by Hitachi High-Technologies Corp.); and respective forms observed were compared and their results are shown in Table 7-1 to Table 7-2.
(1) Etching Condition by $CHF_3/CF_4$-Based Gas
Apparatus: Dry etching apparatus Telius SP manufactured by Tokyo Electron Limited
Etching Condition (1):
    Chamber pressure: 10 Pa
    Upper/Lower RF power: 500 W/300 W
    $CHF_3$ gas flow rate: 50 ml/min
    $CF_4$ gas flow rate: 150 ml/min
    Ar gas flow rate: 100 ml/min
    Treating time: 40 sec
(2) Etching Condition by $O_2/N_2$-Based Gas
Apparatus: Dry etching apparatus Telius SP manufactured by Tokyo Electron Limited
Etching Condition (2):
    Chamber pressure: 2 Pa
    Upper/Lower RF power: 1000 W/300 W
    $O_2$ gas flow rate: 300 ml/min
    $N_2$ gas flow rate: 100 ml/min
    Ar gas flow rate: 100 ml/min
    Treating time: 30 sec

TABLE 7-1

| | Silicon-containing film | ArF Resist | Pattern profile of cross section after development | Pattern profile of cross section of spin-on-carbon film after dry etching | Pattern roughness |
|---|---|---|---|---|---|
| Example 3-1 | Film11 | PR-1 | vertical profile | vertical profile | 1.5 nm |
| Example 3-2 | Film12 | PR-1 | vertical profile | vertical profile | 1.9 nm |
| Example 3-3 | Film13 | PR-1 | vertical profile | vertical profile | 1.7 nm |
| Example 3-4 | Film14 | PR-1 | vertical profile | vertical profile | 1.7 nm |
| Example 3-5 | Film15 | PR-1 | vertical profile | vertical profile | 1.6 nm |
| Example 3-6 | Film16 | PR-1 | vertical profile | vertical profile | 1.6 nm |
| Example 3-7 | Film17 | PR-1 | vertical profile | vertical profile | 1.9 nm |
| Example 3-8 | Film18 | PR-1 | vertical profile | vertical profile | 1.8 nm |
| Example 3-9 | Film19 | PR-1 | vertical profile | vertical profile | 1.9 nm |
| Example 3-10 | Film20 | PR-1 | vertical profile | vertical profile | 1.9 nm |
| Example 3-11 | Film21 | PR-2 | vertical profile | vertical profile | 1.6 nm |
| Example 3-12 | Film22 | PR-2 | vertical profile | vertical profile | 1.7 nm |
| Example 3-13 | Film23 | PR-2 | vertical profile | vertical profile | 1.9 nm |
| Example 3-14 | Film24 | PR-2 | vertical profile | vertical profile | 1.9 nm |
| Example 3-15 | Film25 | PR-2 | vertical profile | vertical profile | 1.8 nm |
| Example 3-16 | Film26 | PR-2 | vertical profile | vertical profile | 1.7 nm |
| Example 3-17 | Film33 | PR-2 | vertical profile | vertical profile | 1.9 nm |
| Example 3-18 | Film34 | PR-2 | vertical profile | vertical profile | 1.9 nm |
| Example 3-19 | Film35 | PR-2 | vertical profile | vertical profile | 1.8 nm |
| Example 3-20 | Film36 | PR-2 | vertical profile | vertical profile | 1.7 nm |

TABLE 7-2

| | Silicon-containing film | ArF Resist | Pattern profile of cross section after development | Pattern profile of cross section of spin-on-carbon film after dry etching | Pattern roughness |
|---|---|---|---|---|---|
| Comparative Example 3-1 | Film27 | PR-1 | undercut profile | pattern-waviness profile | 4.9 nm |
| Comparative Example 3-2 | Film28 | PR-1 | negative profile | pattern-waviness profile | 5.1 nm |
| Comparative Example 3-3 | Film29 | PR-1 | undercut profile | pattern-waviness profile | 4.0 nm |
| Comparative Example 3-4 | Film30 | PR-1 | undercut profile | pattern-waviness profile | 4.5 nm |
| Comparative Example 3-5 | Film31 | PR-1 | negative profile | pattern-waviness profile | 4.9 nm |
| Comparative Example 3-6 | Film32 | PR-1 | undercut profile | pattern-waviness profile | 4.2 nm |
| Comparative Example 3-7 | Film37 | PR-1 | undercut profile | pattern-waviness profile | 4.5 nm |

As shown in Table 7-1, it was recognized that the present invention (Examples 3-1 to 3-20) was also excellent in resist profile after development, and in profile shape and pattern roughness of the spin-on carbon film after processing thereof.

In turn, in each of Comparative Examples 3-1 to 3-7 as shown in Table 7-2, collapse was caused in the resist upper layer in an undercut shape or negative shape, and pattern wiggling was caused upon etching of the spin-on carbon film, resulting in considerably deteriorated pattern roughness of the spin-on carbon film after etching.

The present invention is not limited to the above embodiments. The above embodiments are merely illustrative, and whatever having the substantially same configurations as the technical concept recited in the appended claims of the present application and exhibiting the same functions and effects are embraced within the technical scope of the present invention.

For example, the composition for forming silicon-containing film of the present invention can also be preferably used in a case of conducting exposure by a mask of a lattice pattern, a dot pattern, or a combined pattern of dot pattern and lattice pattern, to thereby conduct development accompanied by positive-negative reversal by an organic solvent, so as to form a hole pattern, thereby enabling to form a fine hole pattern.

What is claimed is:

1. A patterning process for forming a negative pattern by lithography, comprising at least the steps of:
   (i) using a composition for forming a silicon-containing film, containing a silicon-containing compound (A) and an organic solvent (B), to form a silicon-containing film; wherein:
   the silicon-containing compound (A) is obtained by hydrolytically condensing a mixture comprising: one or more compounds selected from a hydrolyzable silicon compound represented by the following general formula (A-1), a hydrolyzate of the compound, a condensate of the compound, and a hydrolysis condensate of the compound; and one or more compounds selected from a reactive compound represented by the following general formula (A-2-2), a hydrolyzate of the compound, a condensate of the compound, and a hydrolysis condensate of the compound, or
   one or more compounds selected from a hydrolyzable silicon compound represented by the following general formula (A-1), a hydrolyzate of the compound, a condensate of the compound, and a hydrolysis condensate of the compound;
   one or more compounds selected from the group consisting of a hydrolyzable silicon compound represented by the following general formula (A-2-1), a hydrolyzate of the compound, a condensate of the compound, a hydrolysis condensate of the compound;

and one or more compounds selected from a reactive compound represented by the following general formula (A-2-2), a hydrolyzate of the compound, a condensate of the compound, and a hydrolysis condensate of the compound, $$(R^2)_{m2}(OR^3)_{(3-m2)}Si-R^1-Si(R^4)_{m4}(OR^5)_{(3-m4)} \quad (A-1)$$

$$R^{11}{}_{m11}R^{12}{}_{m12}R^{13}{}_{m13}Si(OR^{14})_{(4-m11-m12-m13)} \quad (A-2-1)$$

$$U(OR^{21})_{m21}(OR^{22})_{m22}(O)_{m23/2} \quad (A-2-2),$$

where:
- $R^1$ represents a single bond, or a divalent organic group having 1 to 20 carbon atoms;
- each $R^2$ and $R^4$ independently represents a hydrogen atom, or a monovalent organic group having 1 to 20 carbon atoms;
- each $R^3$ and $R^5$ independently represents a hydrogen atom, or an alkyl group having 1 to 6 carbon atoms;
- m2 and m4 represent integers satisfying $0 \le m2+m4 \le 2$;
- each $R^{11}$, $R^{12}$, and $R^{13}$ independently represents a hydrogen atom, or a monovalent organic group having 1 to 30 carbon atoms;
- each m11, m12, and m13 independently represents 0 or 1, and satisfy that $0 \le m11+m12+m13 \le 3$;
- $R^{14}$ represents a hydrogen atom, or an alkyl group having 1 to 6 carbon atoms;
- each $R^{21}$ and $R^{22}$ independently represents a hydrogen atom, or an organic group having 1 to 30 carbon atoms;
- m21+m22+m23/2 represents a valence to be determined by a kind of U;
- each m21, m22, and m23 independently represent an integer of 0 or more; and
- U represents an element belonging to the III group, IV group, and V group in the periodic table, except for carbon and silicon;

(ii) using a silicon-free resist composition to form a photoresist film on the silicon-containing film;
(iii) heat-treating the photoresist film, and subsequently exposing the photoresist film to a high energy beam; and
(iv) using a developer comprising an organic solvent to dissolve an unexposed area of the photoresist film, thereby obtaining a negative pattern.

2. The patterning process according to claim 1, wherein the composition used for forming silicon-containing film further contains:

(C) one or more compounds each represented by the following general formula (3) or general formula (4), $$L_aH_bX \quad (3)$$

where:
- L represents a cation of an element belonging to the 1a group of the periodic table,
- X represents one of a hydroxide ion, and a monovalent or di- or more valent organic acid ion having 1 to 30 carbon atoms, which acid ion may be substituted with a halogen atom, phosphoric acid ion, nitric acid ion, or carbonic acid ion,
- a represents an integer of 1 or more,
- b represents an integer of 0, 1, or more, and
- a+b represents a valence to be determined by the X, and $$M_{a'}H_{b'}A \quad (4)$$

where:
- M represents a sulfonium, iodonium, or ammonium,
- A represents one of a hydroxide ion, and a monovalent or di- or more valent organic acid ion having 1 to 30 carbon atoms, which acid ion may be substituted with a halogen atom, phosphoric acid ion, nitric acid ion, or carbonic acid ion, or a halogen ion, or a halogen acid ion,
- a' represents an integer of 1 or more,
- b' represents an integer of 0, 1, or more, and
- a'+b' represents a valence to be determined by the A; and (D) a monovalent or di- or more valent organic acid having 1 to 30 carbon atoms.

3. The patterning process according to claim 2, wherein the M in the general formula (4) is a tertiary sulfonium, secondary iodonium, or quaternary ammonium.

4. The patterning process according to claim 2, wherein the composition used for forming the silicon-containing film is configured to form the silicon-containing film having a contact angle between 20° inclusive and 70° exclusive relative to pure water.

5. The patterning process according to claim 3, wherein the composition used for forming the silicon-containing film is configured to form the silicon-containing film having a contact angle between 20° inclusive and 70° exclusive relative to pure water.

6. The patterning process according to claim 1, wherein the U in the general formula (A-2-2) is boron, aluminum, gallium, yttrium, germanium, titanium, zirconium, hafnium, bismuth, tin, phosphorus, vanadium, arsenic, antimony, niobium, or tantalum.

7. The patterning process according to claim 6, wherein the composition used for forming the silicon-containing film is configured to form the silicon-containing film having a contact angle between 20° inclusive and 70° exclusive relative to pure water.

8. The patterning process according to claim 1, wherein the composition used for forming the silicon-containing film is configured to form the silicon-containing film having a contact angle between 20° inclusive and 70° exclusive relative to pure water.

9. The patterning process according to claim 1, wherein the patterning process of the photoresist film is conducted as pattern formation based on photolithography at a wavelength between 10 nm inclusive and 300 nm inclusive, direct writing by electron beam, or nano-imprinting, or any combination thereof.

10. The patterning process according to claim 1, wherein the developer contains, as a developer component, one or more selected from 2-octanone, 2-nonanone, 2-heptanone, 3-heptanone, 4-heptanone, 2-hexanone, 3-hexanone, diisobutylketone, methylcyclohexanone, acetophenone, methylacetophenone, propyl acetate, butyl acetate, isobutyl acetate, amyl acetate, butenyl acetate, isoamyl acetate, phenyl acetate, propyl formate, butyl formate, isobutyl formate, amyl formate, isoamyl formate, methyl valerate, methyl pentenoate, methyl crotonate, ethyl crotonate, methyl lactate, ethyl lactate, propyl lactate, butyl lactate, isobutyl lactate, amyl lactate, isoamyl lactate, methyl 2-hydroxy-isobutyrate, ethyl 2-hydroxy-isobutyrate, methyl benzoate, ethyl benzoate, phenyl acetate, benzyl acetate, methyl phenylacetate, benzyl formate, phenylethyl formate, methyl 3-phenyl-propionate, benzyl propionate, ethyl phenylacetate, and acetic acid 2-phenylethyl.

11. The patterning process according to claim 10, wherein the developer contains the developer components in a total amount of 50 wt % or more.

12. The patterning process according to claim 1, wherein the step of forming the silicon-containing film comprises a step of forming the silicon-containing film on an organic lower layer film or organic hard mask, after forming the organic lower layer film or organic hard mask on a process-targeted workpiece.

13. The patterning process according to claim 12, further comprising the steps of:
- after obtaining the negative pattern, using the photoresist film as a mask formed with the pattern, to transfer the pattern to the silicon-containing film by dry etching;
- using the silicon-containing film as a mask having the pattern transferred thereto, to transfer the pattern to the organic lower layer film or the organic hard mask by dry etching; and
- using the organic lower layer film or the organic hard mask as a mask having the pattern transferred thereto, to transfer the pattern to a process-targeted workpiece by dry etching.

14. The patterning process according to claim 1, wherein the process-targeted workpiece comprises a semiconductor substrate formed thereon with a metal film, metal carbide film, metal oxide film, metal nitride film, or metal oxide nitride film.

15. The patterning process according to claim 14, wherein the process-targeted workpiece is configured with a metal which is one of silicon, titanium, tungsten, hafnium, zirconium, chromium, germanium, copper, aluminum, iron, and an alloy thereof.

* * * * *